United States Patent
Nakamura et al.

(10) Patent No.: US 7,384,860 B2
(45) Date of Patent: Jun. 10, 2008

(54) METHOD OF MANUFACTURING A SEMICONDUCTOR DEVICE

(75) Inventors: Osamu Nakamura, Atsugi (JP); Manabu Katsumura, Atsugi (JP); Shunpei Yamazaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 778 days.

(21) Appl. No.: 10/941,000

(22) Filed: Sep. 15, 2004

(65) Prior Publication Data

US 2005/0054181 A1   Mar. 10, 2005

Related U.S. Application Data

(62) Division of application No. 09/748,121, filed on Dec. 27, 2000, now Pat. No. 6,821,827.

(30) Foreign Application Priority Data

Dec. 28, 1999  (JP) ................. 11-375607

(51) Int. Cl.
  *H01L 21/36* (2006.01)
  *H01L 21/20* (2006.01)
  *H01L 21/84* (2006.01)
(52) U.S. Cl. ............... 438/486; 438/166; 257/E21.133; 257/E21.32; 257/E21.413
(58) Field of Classification Search ............... 438/166, 438/486
See application file for complete search history.

(56) References Cited

U.S. PATENT DOCUMENTS

| | | |
|---|---|---|
| 5,700,333 A | 12/1997 | Yamazaki et al. |
| 5,814,924 A * | 9/1998 | Komatsu ................. 313/309 |
| 5,897,347 A | 4/1999 | Yamazaki et al. |
| 5,915,174 A | 6/1999 | Yamazaki et al. |
| 5,961,743 A | 10/1999 | Yamazaki et al. |

(Continued)

FOREIGN PATENT DOCUMENTS

JP  05-109737  4/1993

(Continued)

OTHER PUBLICATIONS

Specification with originally filed claims, Drawings, Filing Receipt and pending claims for U.S. Appl. No. 08/690,747, filed Aug. 1, 1996, "Method of Manufacturing Semiconductor Device," Hisashi Ohtani et al.

*Primary Examiner*—Alexander Ghyka
(74) *Attorney, Agent, or Firm*—Eric J. Robinson; Robinson Intellectual Property Law Office, P.C.

(57) ABSTRACT

The present invention relates to a method of manufacturing a semiconductor device having an excellent gettering effect. In this method, when phosphorus is added to a poly-Si film, which has been crystallized by the addition of a metal, to subject the resultant poly-Si film to the heat treatment to carry out gettering therefor, the device is performed for the shape of the island-like insulating film on the poly-Si film which is employed when implanting phosphorus. Thereby, the area of the boundary surface between the region to which phosphorus has been added and the region to which no phosphorus has been added is increased to enhance gettering efficiency.

21 Claims, 25 Drawing Sheets

U.S. PATENT DOCUMENTS

| | | |
|---|---|---|
| 5,970,366 A | 10/1999 | Okonogi |
| 6,066,518 A | 5/2000 | Yamazaki |
| 6,072,193 A | 6/2000 | Ohnuma et al. |
| 6,087,679 A | 7/2000 | Yamazaki et al. |
| 6,121,660 A | 9/2000 | Yamazaki et al. |
| 6,133,119 A | 10/2000 | Yamazaki |
| 6,156,590 A | 12/2000 | Yamazaki et al. |
| 6,156,628 A * | 12/2000 | Ohnuma et al. ............ 438/486 |
| 6,160,268 A | 12/2000 | Yamazaki |
| 6,165,824 A | 12/2000 | Takano et al. |
| 6,787,407 B2 | 9/2004 | Nakamura et al. |
| 6,893,503 B1 | 5/2005 | Ohnuma et al. |

FOREIGN PATENT DOCUMENTS

| | | |
|---|---|---|
| JP | 10-208988 | 8/1998 |
| JP | 10-209167 | 8/1998 |
| JP | 10-270363 | 10/1998 |
| JP | 11-040499 | 2/1999 |
| JP | 11-054760 | 2/1999 |
| JP | 11-087733 | 3/1999 |
| JP | 11-204435 | 7/1999 |

* cited by examiner

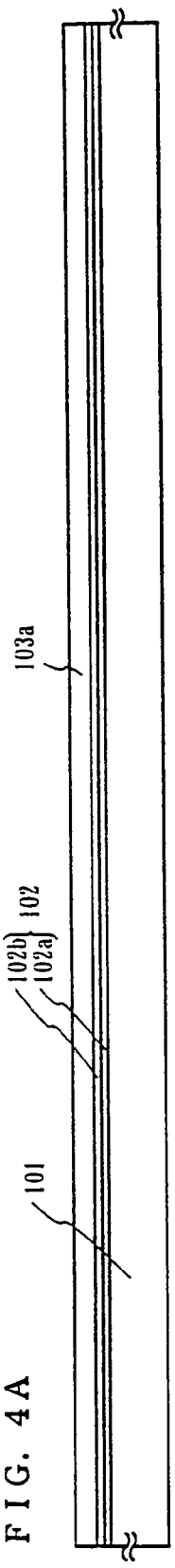
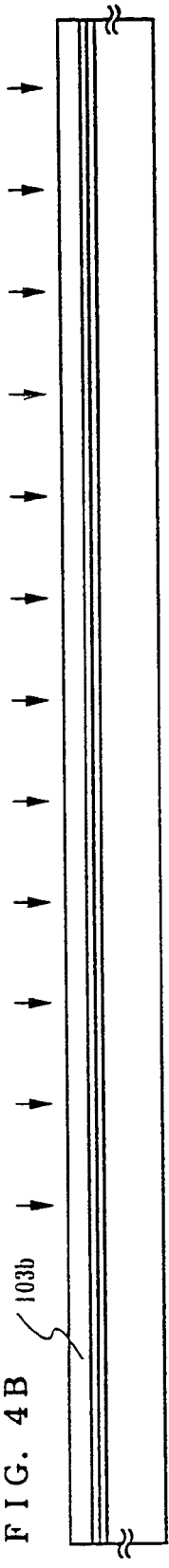
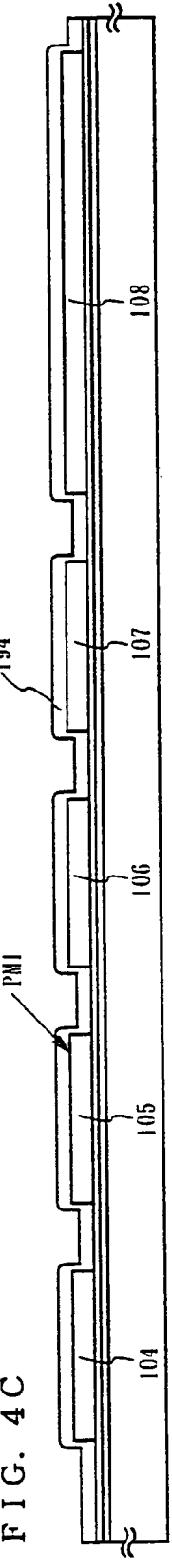
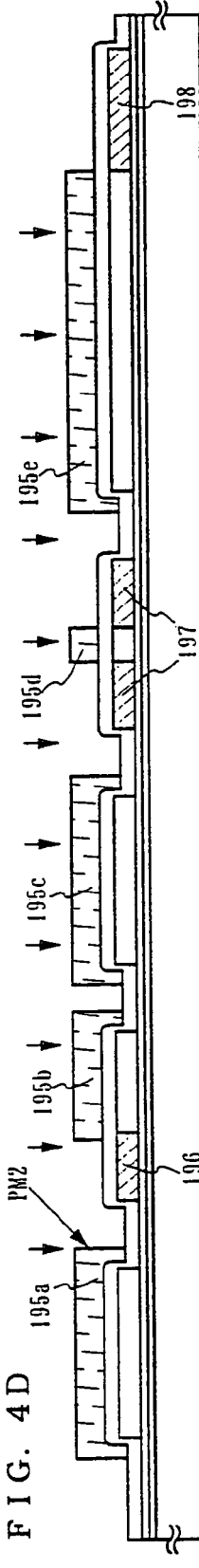
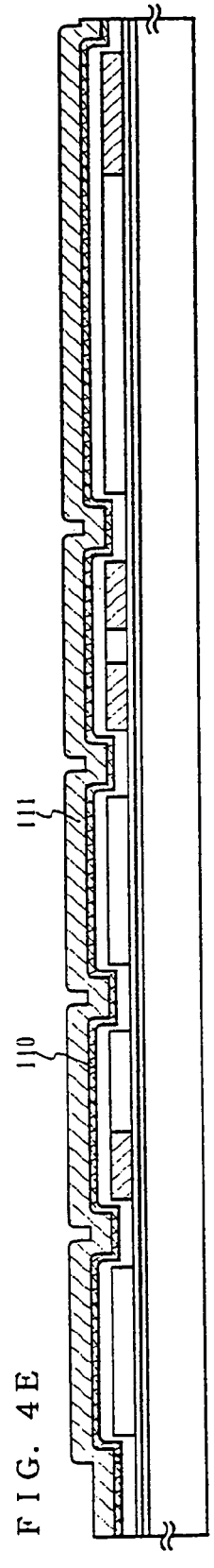

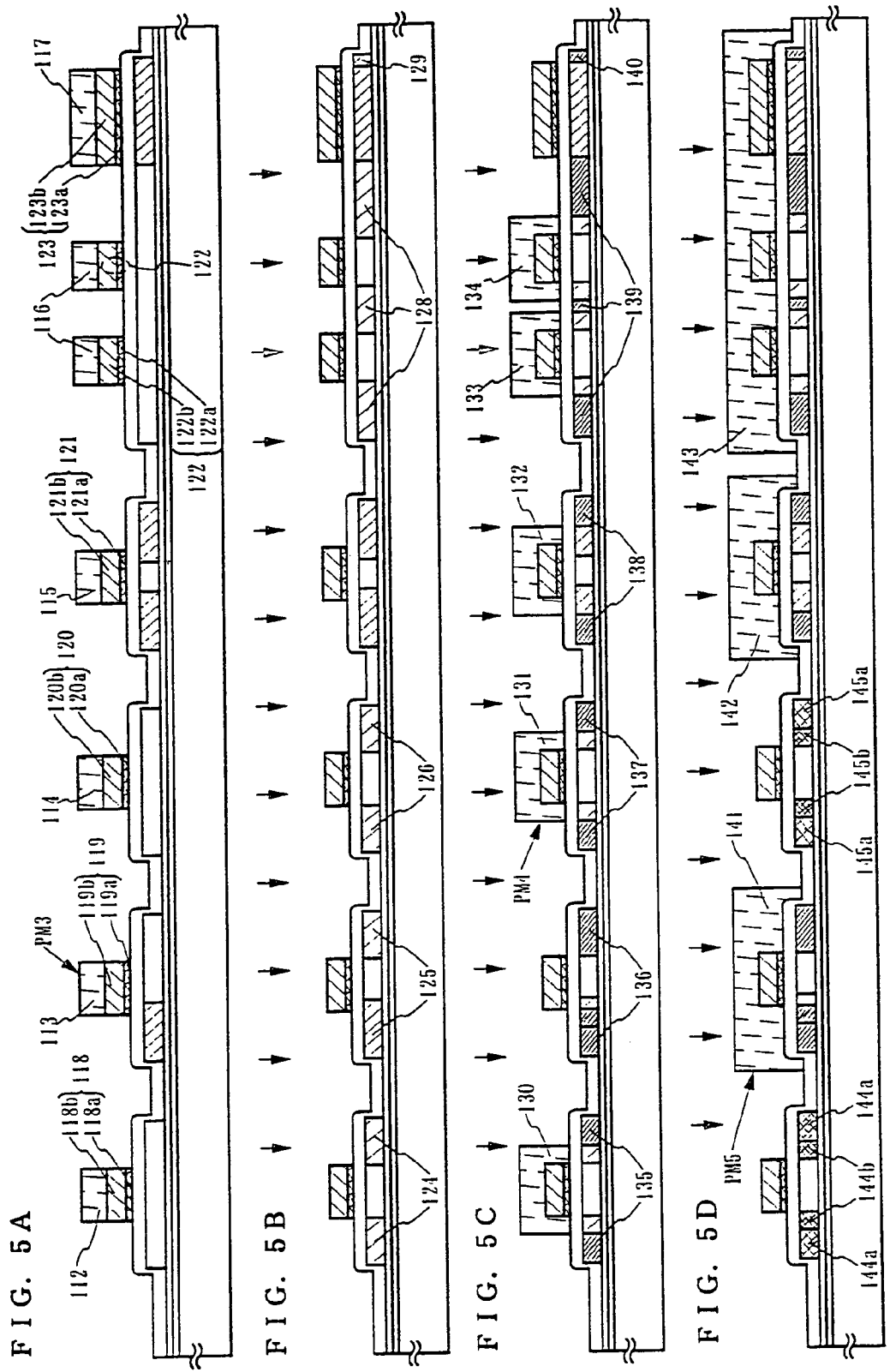

METHOD OF MANUFACTURING A SEMICONDUCTOR DEVICE

FIELD OF THE TECHNIQUE

The present invention is a technique relating to a method of manufacturing a semiconductor device utilizing a crystalline semiconductor thin film containing silicon as a main component. More particularly, the invention relates a method of manufacturing a thin film transistor (hereinafter, referred to as TFT) utilizing a substrate having a crystalline semiconductor thin film containing silicon as the main component on an insulating substrate.

Throughout the present specification, the semiconductor device generally designates a device which functions utilizing a semiconductor. Thus, the electronic device or the like mounted thereto such as an arithmetic processing device, a storage processing device, or an electro-optical device as well as a single element such as the TFT are all contained in the category of the semiconductor device.

BACKGROUND ART

An active matrix liquid crystal display device is a monolithic display device in which a pixel matrix circuit and a driver circuit are provided on the same substrate. In the monolithic display device, it is the main stream, to employ the thin film transistors (TFTs). In the thin film transistor, an amorphous silicon film is formed on an insulating substrate such as a glass substrate or a quartz substrate to obtain an active layer. The development of a system-on-panel incorporating therein logic circuits such as a memory circuit and a clock generating circuit utilizing the TFTs has been advancing.

The high speed operation is required for such a driver circuit and the logic circuit, and therefore it is not suitable therefor that the amorphous silicon film is formed as the active layer on the quartz substrate or the glass substrate to obtain an element. For this reason, at present TFT in which a polycrystalline silicon film is used as the active layer is manufactured.

There are present some technologies in which after having deposited the amorphous silicon film on the quartz substrate or the glass substrate, the polycrystalline silicon film is obtained through crystallization. Of those, there is known a technique in which the catalytic metal element, with which the excellent electrical characteristics of the element are obtained when forming the element, and which promotes the crystallization of the amorphous silicon film, is added to the film to conduct the crystallization by a heat treatment. This technique will hereinbelow be described in more detail.

A semiconductor thin film having the amorphous structure containing as a main component a silicon is formed on an insulating substrate such as a quartz substrate or a glass substrate into a thickness on the order of 50 nm to 100 nm by LPCVD or the PECVD. Metal is added to the surface of the semiconductor thin film or into the semiconductor thin film having the above-mentioned amorphous structure to carry out the heat treatment therefor, thereby crystallizing the semiconductor thin film having the above-mentioned amorphous structure in the solid phase. The semiconductor thin film having the above-mentioned amorphous structure is crystallized in the solid phase so that a crystalline semiconductor thin film containing silicon as the main component is formed. Then, it is confirmed by the inventors of the present invention that the addition of the metal promotes the solid-phase crystallization, and it is therefore said that the metal acts as the catalyst during the solid-phase crystallization. In the present specification, the metal is referred to as the catalytic metal.

As for the phenomenon that the semiconductor thin film having the above-mentioned amorphous structure is crystallized by the heat treatment with the metal as a catalyst, a large number of reports have been made as the Metal Induced Lateral Crystallization (MILC). As the typical ones, there are the transition metal elements such as nickel (Ni), cobalt (Co), palladium (Pd), platinum (Pt), and copper (Cu). The presence of the catalytic metal becomes advantageous in the temperature and the time required for the semiconductor thin film having the above-mentioned amorphous structure to be crystallized in the solid phase as compared with the case where no catalytic metal is added. As a result, it has become clear that the Ni element shows excellent property as the catalytic metal. Hereinbelow, descriptions will be made on the assumption that the Ni element is employed as the catalytic metal.

The heat treatment required for the solid phase crystallization of the semiconductor thin film having the above-mentioned amorphous structure is performed at from 400° C. to 700° C. for several hours or more by the electric furnace, etc.

In the present specification, the semiconductor thin film having the amorphous structure containing silicon as the main component includes a SiGe thin film having the amorphous structure, in which the component ratio of Ge is less than 50%.

DISCLOSURE OF THE INVENTION

For the catalytic metal for promoting the crystallization of the semiconductor thin film having the above-mentioned amorphous structure, the transition metal element such as nickel (Ni), cobalt (Co), palladium (Pd), platinum (Pt), or copper (Cu) is employed. As generally well known, the metal such as Ni, if it is present in crystalline silicon, forms the deep levels to have a bad influence on the electrical characteristics and the reliability of the element. Therefore, the metal such as a Ni element needs to be removed from the region (element active region) in which the element is formed, and is used as the element. The above-mentioned crystalline semiconductor thin film is also concerned about the bad influence exerted on the element characteristics due to the catalytic metal.

Therefore, the metal such as the Ni element needs to be removed from the element active region to the degree at which it does not have a bad influence on the electrical characteristics. Removing the metal such as the Ni element from the element active region in the crystalline silicon is generally called gettering. The method of gettering which has been confirmed by the inventors of the present invention will hereinbelow be described.

An insulating film is formed on the above-mentioned crystalline semiconductor thin film. The insulating film is formed using a silicon oxide film, a silicon nitride film, or the like by the CVD apparatus or a sputtering apparatus. Then, the insulating film is formed into island-like shape. The island-like structure of the insulating film can be formed by utilizing photolithography and etching, which are general in the semiconductor technology.

A nonmetal element or ion of the nonmetal element is added to the crystalline semiconductor thin film with the insulating film as a mask, and a region, to which the nonmetal element or the ion of the nonmetal element has been added, is formed on the crystalline semiconductor thin film. That is, the nonmetal element or the ion of the nonmetal element is not added to the region in which the island-like structure of the insulating film is present on the crystalline semiconductor thin film, but are added to the region in which the island-like structure of the insulating film is absent. The nonmetal element or the ion of the nonmetal element is added thereto by thermal diffusion from a gas phase or by utilizing an ion implantation apparatus.

The nonmetal element or the ion of the nonmetal element is one kind of or plural kinds selected from the group consisting of boron (B), silicon (Si), phosphorus (P), arsenic (As), helium (He), neon (Ne), argon (Ar), krypton (Kr), and xenon (Xe).

The mechanism and the phenomenon of gettering of the transition metal elements in monocrystalline silicon are actively studied, and as a result, a considerable part thereof has become clear. While some of gettering in the polycrystalline silicon does not become clear in detail, the case of the monocrystalline silicon may be referred therefor. In polycrystalline silicon as well, the damage which is caused by the ion implantation method becomes an effective gettering. The mark which is generated by knocking over the atoms by the ion implantation becomes locally amorphous, and when recrystallizing the amorphous part by the subsequent heat treatment, the crystal defects etc. are generated with high density. Therefore, any of the nonmetal elements or ions of the nonmetal elements which are added thereto by the ion implantation during gettering is available as long as the ion implantation is possible therefor, it is hardly diffused up to the element active region even by the heat treatment because the diffusion coefficient thereof is smaller than that of the metal gettered, and it has no influence on the element characteristics because it is electrically inactive.

As for the elements satisfying the above-mentioned conditions, there are one kind or plural kinds of elements selected from the group consisting of B, Si, P, As, He, Ne, Ar, Kr, and Xe. However, it is conceivable that the situation of generation of the damages such as the grain boundaries, the micro-twins, the stacking faults, the dislocation loops, and the dislocation networks differ depending on the difference in the ion kind, the dose, the acceleration energy and the like. In addition, if phosphorus (P) or the like, even when diffused from the gas phase, is added to crystalline silicon, then misfit transition is formed to become the gettering source. It is confirmed by the present inventors that adding phosphorus (P) to the above-mentioned crystalline semiconductor thin film is effective to gettering of the above-mentioned catalytic metal.

Next, the crystalline semiconductor thin film is subjected to the heat treatment at the temperature equal to or higher than 400° C. and equal to or lower than 1,000° C. so that the metal is gettered to the region to which the nonmetal element or the ions of the nonmetal element has(have) been added. It is confirmed on the basis of the experiment by the inventors of the present invention so that in particular, phosphorus (P) has a remarkable gettering effect.

Generally, gettering forms the site for gettering outside the element active region, and the metal is segregated to the gettering site by the heat treatment. While in the technique of forming semiconductor element including the formation of the above-mentioned thin film, the heat treatment is essential thereto, and it is desirable that, the heat supply amount=the temperature×the time, is small as much as possible. If the heat supply amount is reduced, then this becomes economically advantageous so that the time can be shortened. In addition thereto, the warp or the contraction of the semiconductor substrate can be reduced, and also the generation of such as the excessive stress in the vicinity of the element active region can be prevented. In addition, the less the residual metal is, which can not be gettered in the element active region after the completion of the gettering process, the better it is.

A semiconductor thin film 10102 having the amorphous structure containing silicon as the main component is formed on a glass substrate or a quartz substrate 10101. Metal is then added to the semiconductor thin film 102 having the amorphous structure. While as for the above-mentioned metal, there are conceivable nickel (Ni), cobalt (Co), palladium (Pd), platinum (Pt), copper (Cu) or the like, Ni is employed in the item of means for solving the problem, and also Ni acetate solution 10103 is applied thereto.

The semiconductor thin film 10102 having the amorphous structure is crystallized in solid phase with the metal as the catalyst by the heat treatment at the temperature equal to or higher than 400° C. and equal to or lower than 700° C. to obtain a crystalline semiconductor thin film containing silicon as the main component (refer to FIG. 1A). It is confirmed on the basis of the experiment by the inventors of the present invention that Ni is a metal effective in promoting the solid-phase crystallization.

After an insulating film has been deposited on a crystalline semiconductor thin film 10107, the insulating film is fine-patterned into an island-like structure 10104. Then, nonmetal element or ions of the nonmetal element is(are) added to the crystalline semiconductor thin film with the island-like structure 10104 of the insulating film as a mask (refer to FIG. 1B). It is assumed that phosphorus (P) is employed as the nonmetal element in the item of means for solving the problem.

It is conceivable that in addition to phosphorus (P), B, Si, As, He, Ne, Ar, Kr, Xe or the like is effective for gettering. Each of these elements is the element which can introduce the damage to a poly-Si film by the ion implantation and the subsequent heat treatment, which is more hard to diffuse than the metal to be gettered, or which is inactive and hence does not have an influence on the element characteristics.

Regions 10106 and 10109 to which the nonmetal element or the ions of the nonmetal element has(have) been added are formed on the crystalline semiconductor thin film. The crystalline semiconductor thin film is subjected to the heat treatment at the temperature equal to or higher than 400° C. and equal to or lower than 1,000° C. to getter the metal to the region to which the nonmetal element or the ions of the nonmetal element has(have) been added (refer to FIG. 1C). In FIG. 1C, reference numeral 10110 designates the direction of the movement of Ni.

One of the features of the present invention resides in that it has the process of adding nonmetal element or ions of the nonmetal element to a crystalline semiconductor thin film to form the gettering site and the process of carrying out the heat treatment, so that the metal contained in a crystalline semiconductor thin film is moved by the heat treatment to be captured in the gettering site (the region to which the nonmetal element or the ions of the nonmetal element has(have) been added), and as a result the metal is removed or reduced from the crystalline semiconductor thin film other than in the gettering site.

The main constitution of the present invention is that the island-like insulating film shapes 10301 and 10201 for the surface parallel with a surface 10203 of the crystalline semiconductor thin film 10206 are polygons having n (n>20) vertexes and also a polygon having m (m>8) vertexes, in which the interior angle is equal to or larger than 180°, of these vertexes.

From the foregoing, the area of a boundary surface 10108 between the region 10106 and 10109 to which the nonmetal element or the ions of the nonmetal element has(have) been added and the region to which the nonmetal element or the ions of the nonmetal element has(have) not been added is increased to improve at least one of the efficiency and the effect of gettering.

In general, the progress of gettering includes the steps of releasing the metal from the element active region, the diffusion step and the step of capturing the metal in the gettering site. The area of the boundary surface therebetween is increased, the phenomenon of diffusing the metal is promoted, and so forth, to thereby aim at enhancing the efficiency or the effect of gettering.

BRIEF DESCRIPTION OF THE DRAWINGS

FIGS. 4A-4E are cross sectional views showing the steps of a method of manufacturing a pixel TFT and a TFT for a driving circuit.

FIGS. 5A-5D are cross sectional views showing the steps of a method of manufacturing a pixel TFT and a TFT for a driving circuit.

BEST MODE FOR CARRYING OUT THE INVENTION

Figure 1A:
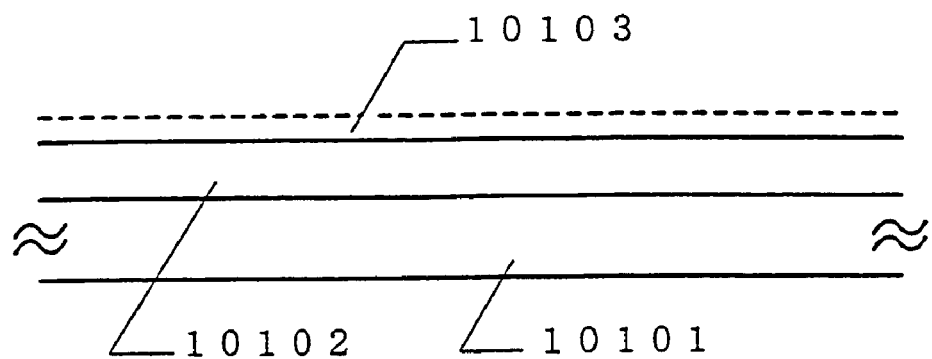
FIGS. 1A-1C are schematic views showing the crystallization of a semiconductor thin film and gettering of the present invention.

An amorphous silicon film (a-Si film) 10102 of about 50 nm thickness is deposited on a quartz substrate 10101 by utilizing the LPCVD apparatus.

Ni acetate solution 10103 is then dropped thereonto by utilizing the spin coating method. The Ni concentration of the Ni acetate solution is about 10 ppm in terms of weight. Before the Ni acetate solution is dropped, a ultra thin silicon oxide film ($SiO_2$ film) needs to be formed by applying the UV light in the oxygen ambient or the like to make the Ni acetate solution easy to be wetted on the surface of the a-Si film.

As for the method of adding the metal such as Ni, in addition to the method of carrying out the addition from the solid phase, there is known a method utilizing the ion implantation system, the method of depositing the metal on the a-Si film by utilizing the evaporation, or the like.

The quartz substrate (having the a-Si film) is heated at 600° C. for several hours or more in nitrogen ambient. It is conformed that by adding Ni element, the whole a-Si film is crystallized in the solid phase in a much shorter time than that in the case where no Ni is added. As a result of the crystallization in the solid phase, a polycrystalline silicon film (poly-Si film) is obtained. Then, it is confirmed by the present inventors that Ni relates to when an initial nucleus is generated in the a-Si film as well as when the whole a-Si film is crystallized.

The phenomenon, in which the crystallization of the a-Si film is promoted by addition of the catalytic metal thereto, is frequently reported as the Metal Induced Lateral Crystallization (MILC). Then, as the catalytic metal, the transition metal element such as nickel (Ni), cobalt (Co), palladium (Pd), platinum (Pt), or copper (Cu) is known. It has been revealed in the experiment by the inventors of the present invention that a Ni element shows excellent property as the catalytic metal.

As generally well known, the metal such as Ni, if it is present in crystalline silicon, forms deep levels and have a bad influence on the electrical characteristics or the reliability of the element. Therefore, the metal such as Ni needs to be removed from the region which has an element formed therein and is used as the element (element active region). The poly-Si film which has been crystallized with the aid of the catalytic metal is also concerned about a bad influence on the element characteristics by the catalytic metal.

Therefore, the metal such as a Ni element needs to be removed from the active region, to the degree at which it does not have an influence on the electrical characteristics. Removing the metal such as a Ni element from the active region in crystalline silicon is in general called gettering.

A silicon oxide film of about 150 nm thickness is deposited on the poly-Si film. The silicon oxide film is the LTO (low temperature oxide) film. As the insulating film to be deposited, in addition to the silicon oxide film, a silicon nitride film or the like may be employed, and the deposition method thereof is implemented by utilizing the PCVD apparatus, the LPCVD apparatus, the sputtering system, or the like.

The deposited poly-Si film is fine-patterned by utilizing the photolithography and the etching in such a way as to become an island-like shape 10104.

Figure 2A:
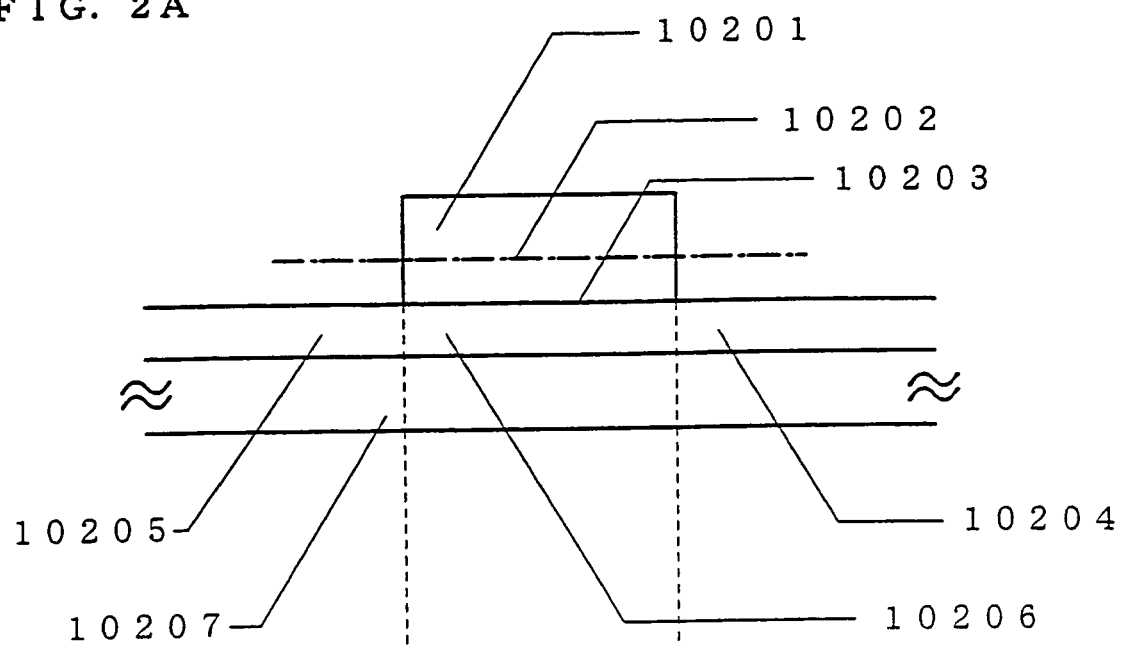
FIGS. 2A-2B are schematic views showing the island-like structure of a semiconductor thin film and a silicon oxide film which is formed during gettering of the present invention.
Figure 2B:
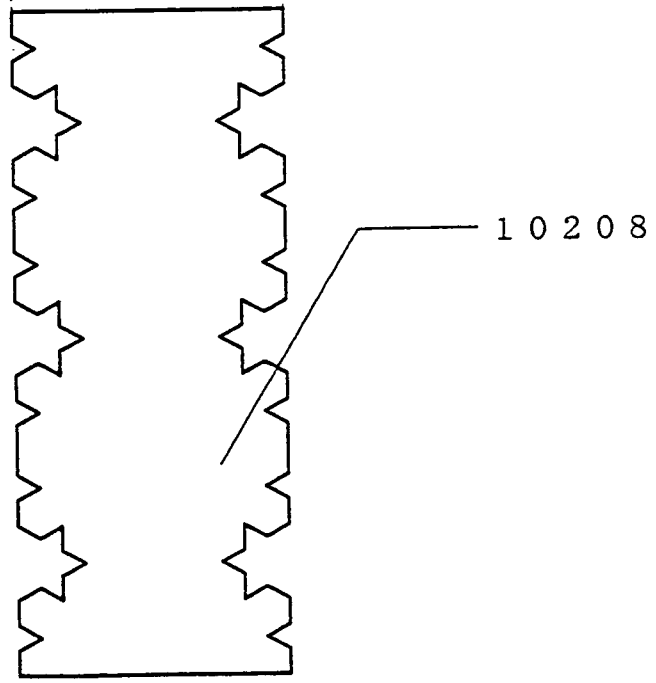

Then, there is considered a cross sectional shape 10208 which is obtained when the above-mentioned island-like structure is cut off by a surface 10202 parallel with a surface 10203 of the poly-Si film. The main structure of the present invention is that the cross sectional shape is the polygon having n (n>20) vertexes and also is the polygon having m (m>8) vertexes, in which the interior angle is equal to or larger than 180°, of these vertexes. In embodiment 1, the cross sectional shape having the island-like shape is made the shape as shown in FIG. 2B by making reference to the Koch curve. The Koch curve is the famous graphic form in the fractal geometry.

Figure 1B:
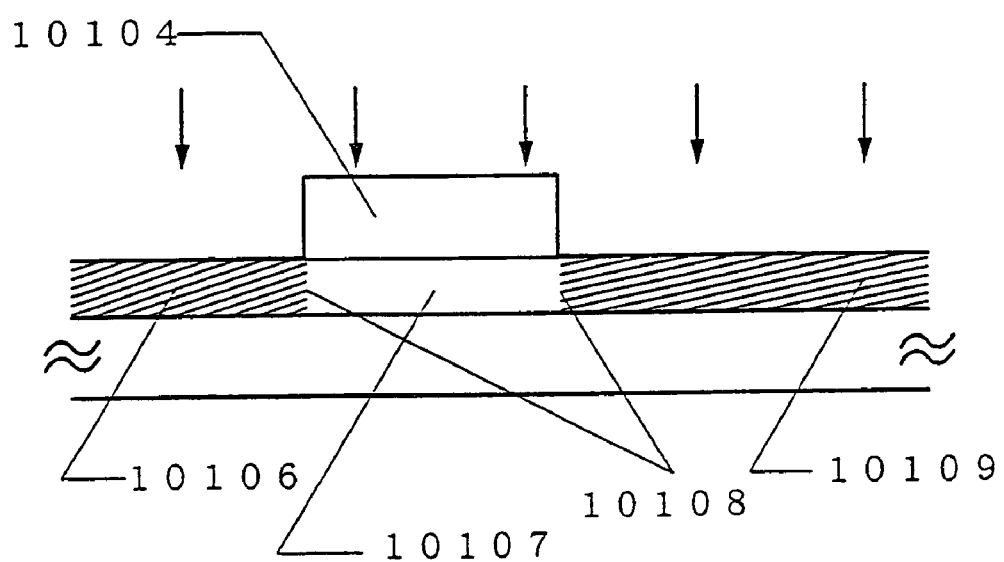

Phosphorus (P) ions are added to the poly-Si film with the island-like structure of the silicon oxide film as the mask by utilizing the plasma doping apparatus (refer to FIG. 1B). Then, the phosphorus ions are added thereto at the acceleration voltage of 10 keV with the ion dose of 1E15 atoms/cm$^2$. Here, taking into the account the thickness of the silicon oxide, the acceleration voltage and the ion dose should be selected in such a way that the P ions do not go through the island-like structure 10104 of the silicon oxide film. In addition to phosphorus (P), B, Si, He, As, Ne, Ar, Kr, Xe or the like is considered to be effective for gettering. Each of these elements is the element which can introduce the damage into the poly-Si film by the ion implantation and the subsequent heat treatment, which is more hardly diffused than the metal to be gettered, or which is inactive and hence does not affect on the element characteristics.

A point of difference of the plasma doping system from the ion implantation system for use in the LSI manufacture is that it is not provided with the mechanism for carrying out the mass separation when implanting the ions. For this reason, the plasma doping system is inferior in the accuracy of controlling the dose and the doping depth to the ion implantation system. However, since the plasma doping system can be effectively performed for the large area, it is frequently used in the TFT manufacture.

Figure 1C:
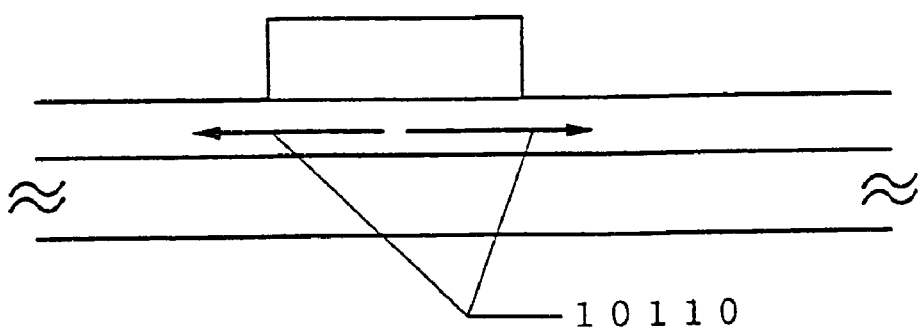

After completion of the implantation of the phosphorus (P) ions, the heat treatment is performed at 600° C. for approximately 5 hours in nitrogen ambient (refer to FIG. 1C) to getter Ni, which is used as the catalytic metal during the crystallization, in the regions 10106 and 10109 in the poly-Si film, to each of which phosphorus (P) has been added. It is already confirmed by the present inventors that after phosphorus (P) has been added thereto, there is shown the remarkable gettering effect. The heat treatment during gettering is performed at the temperature equal to or higher than 400° C. but equal to or lower than 1,000° C.

The reason why the shape of the island-like structure of the silicon oxide film is made the complicated polygon as described above is to increase the area of the surface 10108 in which the region in the poly-Si film to which phosphorus (P) was added and the region to which no phosphorus is added are contacted with each other. Forming the complicated polygon is aimed at enhancing the efficiency or the effect of gettering by increasing the contact area between the phosphorus added region and phosphorus non-added region to promote the phenomenon of the diffusing the metal.

Gettering is performed to reduce the concentration of the metal to be gettered in the element active region to the degree at not to affect the element characteristics.

After completion of the solid-phase crystallization of the a-Si film and gettering, the ordinary manufacture of the TFT array substrate is performed. Further, the liquid crystal device or the organic EL device is manufactured.

Embodiment 1

In Embodiment 1, processes for manufacturing a display device is shown, and a method of manufacturing simultaneously pixel TFTs and storage capacitors of a pixel section, and TFTs of a driving circuit disposed in the periphery of the display region will be explained in detail in accordance with processes with reference to FIGS. 4 to 6.

In FIG. 4A, in addition to glass substrates such as barium borosilicate glass or aluminoborosilicate glass as typified by Corning #7059 glass and #1737 glass, plastic substrates which do not have optical anisotropy such as polyethylene terephthalate (PET), polyethylene naphthalate (PEN), polyethersulfone (PES), etc., can be used as the substrate 101. When the glass substrate is used, the substrate may be heat-treated in advance at a temperature lower than a glass strain point by about 10 to 20° C. A base film 102 made of an insulating film such as a silicon oxide film, a silicon nitride film or a silicon oxynitride film is formed on the surface of the substrate 101, on which TFT is to be formed, in order to prevent the diffusion of impurities from the substrate 101. For example, the silicon oxynitride film 102a is formed from SiH$_4$, NH$_3$ and N$_2$O to a thickness of 10 to 200 nm (preferably, 50 to 100 nm) by plasma CVD, and a hydrogenated silicon oxynitride film 102b is similarly formed from SiH$_4$ and N$_2$O to a thickness of 50 to 200 nm (preferably, 100 to 150 nm) in lamination.

The silicon oxynitride film is formed by using the parallel plate type plasma CVD. The silicon oxynitride film 102a is formed by introducing SiH$_4$ at 10 sccm, NH$_3$ at 100 sccm and N$_2$O at 20 sccm into a reaction chamber under the condition of a substrate temperature of 325° C., a reaction pressure of 40 Pa, a discharge power density of 0.41 W/cm$^2$ and a discharge frequency of 60 MHz. On the other hand, the silicon oxynitride film 102b is formed by introducing SiH$_4$ at 5 sccm, N$_2$O at 120 sccm and H$_2$ at 125 sccm into a reaction chamber under the condition of a substrate temperature of 400° C., a reaction pressure of 20 Pa, a discharge power density of 0.41 W/cm$^2$ and a discharge frequency of 60 MHz. These films can be continuously formed by only changing the substrate temperature and by switching the reactive gases.

The silicon oxynitride film 102a formed under the above mentioned condition has a density of 9.28×10$^{22}$/cm$^3$, has slow etching rate of about 63 nm/min in a mixed solution ("LAL500," a product of Stella Chemifa Co.) containing 7.13% of ammonium hydrogenfluoride (NH$_4$HF$_2$) and 15.4% of ammonium fluoride (NH$_4$F) at 20° C., and the film is dense and hard. When such a film is used for the base film, the diffusion of alkali metal elements from the glass substrate into the semiconductor film formed thereon can be effectively prevented.

Next, a semiconductor film 103a having an amorphous structure is formed to a thickness of 25 to 80 nm (preferably, 30 to 60 nm) by a known method such as plasma CVD or sputtering. For example, the amorphous silicon film is formed to a thickness of 55 nm by plasma CVD. Semiconductor films having such an amorphous structure include an amorphous semiconductor film and a micro crystalline semiconductor film, and a compound semiconductor film having an amorphous structure such as an amorphous silicon-germanium film may also be used. It is possible to continuously form the base film 102 and amorphous semiconductor film 103a. For example, after the silicon oxynitride film 102a and the hydrogenated silicon oxynitride film 102b are formed continuously by plasma CVD as described above, the film formation can be carried out continuously by switching the reactive gases from $SiH_4$, $N_2O$ and $H_2$ to $SiH_4$ and $H_2$, or $SiH_4$ alone, without exposing them once to the atmosphere of the open air. As a result, the contamination of the surface of the hydrogenated silicon oxynitride film 102b can be prevented, and the variance of the characteristics of the TFT to be fabricated and fluctuation of the threshold voltage can be reduced.

In the same way as the embodiment mode 1 of the specification, crystallization using metal catalyst and gettering of the metal are performed. Island shape of the silicon oxide film which was used for gettering is removed by wet etching.

Then, as shown in FIG. 4C, a resist pattern is formed on the crystalline semiconductor film 103b by photolithography that uses a photomask 1 (PM1). The crystalline semiconductor film is divided into an island shape by dry etching, forming thereby island-like semiconductor films 104 to 108. A mixed gas of $CF_4$ and $O_2$ is used for dry etching. A mask layer 194 is then formed from a silicon oxide film having 50 to 100 nm thickness by plasma CVD or sputtering.

An impurity element for imparting p-type may be added at a concentration of about $1 \times 10^{16}$ to $5 \times 10^{17}$ atoms/cm$^3$ to the entire surface of the island-like semiconductor films of this state to control the threshold voltage (Vth) of the TFTs. The elements of the Group XIII of the periodic table such as boron (B), aluminum (Al) or gallium (Ga) are known as the impurity elements for imparting p-type to the semiconductor. Ion implantation or ion doping is known as the method of introducing these elements, and ion doping is suitable for processing a substrate having a large area. According to this ion doping method, diborane ($B_2H_6$) is used as a source gas and boron (B) is added. Implantation of such an impurity element is not always necessary and may be omitted, however, this is the method that can be used appropriately for keeping the threshold voltage of specifically the n-channel TFT, within a predetermined range.

In order to form an LDD region of the n-channel TFT of the driving circuit, an impurity element that imparts n-type is selectively doped into island-like semiconductor films 105 and 107. For this purpose, resist masks 195a to 195e are formed in advance. It is appropriate to use phosphorous (P) or arsenic (As) as the impurity element that imparts n-type. Ion doping using phosphine ($PH_3$) is applied here for doping phosphorous (P). Thus formed impurity regions are low concentration n-type impurity regions 196 and 197 and the phosphorous (P) concentration therein may be in the range of $2 \times 10^{16}$ to $5 \times 10^{19}$ atoms/cm$^3$. Note that throughout the present specification, the concentration of the impurity element that imparts n-type contained in the impurity regions 196 and 197 formed here is indicated by (n$^-$). In addition, an impurity region 198 is a semiconductor film for forming a storage capacitor of the pixel matrix circuit, and this region is also doped with phosphorous (P) at the same concentration. (See FIG. 4D)

Thereafter, the step of activating the doped impurity element is performed. The activation can be performed by heat treatment which uses laser light as described in Embodiment mode 7. An example of the heat treatment condition is as follows: the laser pulse oscillation frequency is 1 kHz and the laser energy density is 100 to 300 mJ/cm$^2$ (typically, 150 to 250 mJ/cm$^2$). Then, the linear beams are irradiated to the entire surface of the substrate, and the overlap ratio of the linear beams at this time is 80 to 99% (preferably, 95 to 99%.)

A gate insulating film 109 is formed from an insulating film containing silicon at a film thickness of between 40 and 150 nm by plasma CVD or sputtering. For example, it is appropriate to form the gate insulating film from a silicon oxide nitride film at a thickness of 120 nm. In addition, a silicon oxide nitride film made from $SiH_4$ and $N_2O$, both doped with $O_2$, is a favorable material for the application here because the fixed electric charge density has been reduced. The gate insulating film, of course, is not limited to such silicon oxide nitride film. A single layer or a laminated layer of other insulating films containing silicon may be used. (See FIG. 4E)

Then, as shown in FIG. 4E, a heat-resistant conductive layer for forming a gate electrode on the gate insulating film 109, is formed. The heat-resistant conductive layer may be formed as a single layer, or if necessary, it may have a laminated structure formed of a plurality of layers, such as two or three layers. Using such heat-resistant conductive materials, a lamination structure of, for example, a conductive layer (A) 110 formed from a conductive nitride metallic film and a conductive layer (B) 111 formed from a metallic film, is appropriate. The conductive layer (B) 111 may be formed from an element selected from the group consisting of tantalum (Ta), titanium (Ti), molybdenum (Mo), and tungsten (W); or an alloy having the above elements as its principal constituent; or an alloy film formed from a combination of the above elements (typically, a Mo—W alloy film and a Mo—Ta alloy film). The conductive layer (A) 110 is formed of elements such as a tantalum nitride (TaN), tungsten nitride (WN), titanium nitride (TiN) films, and a molybdenum nitride (MoN). Additionally, tungsten silicide, titanium silicide, and molybdenum silicide are also applicable for forming the conductive layer (A) 110. For the purpose of lowering the resistance of the conductive layer (B) 111, it is favorable to reduce the concentration of the impurity element contained therein, particularly, the desired oxygen concentration was at 30 ppm or less. For example, a resistivity of 20 µΩcm or less can be realized when the oxygen concentration of tungsten (W) is 30 ppm or less.

It is appropriate to form the conductive layer (A) 110 at a thickness of between 10 and 50 nm (preferably between 20 and 30 nm), and the conductive layer (B) 111 at a thickness of between 200 and 400 nm (preferably between 250 and 350 nm). In the case of using W as the gate electrode, a 50 nm thick conductive layer (A) 111 formed of a tungsten nitride (WN) and a 250 nm thick conductive layer (B) 110 formed of W are formed by sputtering with W as the target and introducing argon (Ar) gas and nitrogen ($N_2$) gas. As another method, the W film may also be formed by thermal CVD using tungsten hexafluoride ($WF_6$). In any case, it is necessary to lower the resistance of the W film for use as the gate electrode, the desired resistivity of the W film is 20 µΩcm or less. Growing larger crystal grains in the W film can lower the resistivity. However, when impurity elements such as oxygen exist a lot in the W film, crystallization is impeded and the resistance of the W film becomes high. Because of this, a W target having 99.9999% degree of purity is utilized for the case of sputtering, and furthermore, sufficient consideration must be made to prevent an impurity from the vapor from mixing into the films during film deposition. Accordingly, a resistivity of between 9 and 20 µΩcm can be realized.

On the contrary, for the case of using a TaN film as the conductive layer (A) 110 and a Ta film as the conductive layer (B) 111, similarly, both can be formed by sputtering. The TaN film, with Ta as the target, is formed by utilizing a mixed gas of Ar and nitrogen as the sputtering gas while only Ar is utilized as the sputtering gas for the Ta film. Further, the internal stress of the films to be formed may be relaxed by adding a moderate amount of Xe or Kr into the sputtering gas of these films to prevent the films from peeling. The resistivity of an α phase Ta film is about 20 µΩcm, and therefore it can be used as the gate electrode. Contrary to this, the resistivity of a β phase Ta film is about 180 µΩcm, and therefore it is unsuitable to be used as the gate electrode. Since the TaN film has a crystal structure close to the α phase, the α phase Ta film can be readily obtained by forming the Ta film on the TaN film. Although not shown in the figure, it is effective to form a phosphorous (P) doped silicon film at a thickness of between 2 and 20 nm under the conductive layer (A) 110. By doing this, the adhesion of the conductive film formed on the silicon film can be improved and averted from being oxidized, as well as preventing the very small amount of alkali metallic elements contained in the conductive layer (A) 110 or the conductive layer (B) 111 from diffusing into the gate insulating film 109. Nevertheless, it is preferred that the conductive layer (B) 111 be formed within the resistivity range of between 10 and 50 µΩcm.

Next, with employment of a photomask 2 (PM2), resist masks 112 through 117 are formed by utilizing the photolithography technique. Then the conductive layer (A) 110 and the conductive layer (B) 111 are etched together to form gate electrodes 118 through 122 and a capacitor wiring 123. The gate electrodes 118 through 122 and the capacitor wiring 123 are integrally formed with layers 118a to 122a formed of the conductive layer (A), and with layers 118b to 122b formed of the conductive layer (B). (See FIG. 5A)

A method of etching the conductive layer (A) and the conductive layer (B) may be appropriately selected by the operator. As stated above, if the conductive layers are formed of a material having W as its principal constituent, it is desired that the dry etching method using high-density plasma be applied for implementing a speedy and precise etching. As one means of attaining high-density plasma, it is appropriate to employ the ICP (Inductively Coupled Plasma) etching devices. In the etching method of W employing the ICP etching device, two types of gas, $CF_4$ and $Cl_2$ are introduced into the reaction chamber as etching gas, pressure is set between 0.5 and 1.5 Pa (preferably 1 Pa), and a high frequency electric power (13.56 MHZ) of between 200 and 1000 W is applied to the inductively coupled portion. At this point, a 20 W high frequency electric power is applied to the stage with a substrate disposed therein. Due to charging a negative electric potential by self-bias, a positive ion is accelerated to thereby perform anisotropy etching. With employment of the ICP etching device, an etching speed of between 2 and 5 nm/sec can be achieved even in a hard metallic film such as W. In order to perform etching without leaving any residues, the etching time may be increased by about 10% to 20% to perform over-etching. However, attention must be paid to the selective ratio of etching with the base at this point. For example, the selective ratio of the oxidized silicon nitride film (the gate insulating film 109) to the W film is between 2.5 and 3. Due to such over-etching treatment, the exposed surface of the oxidized silicon nitride film is etched about 20 to 50 nm, substantially making the film becomes thinner.

The step of doping an impurity element that imparts n type (n⁻⁻ doping step) is performed next to form an LDD region in the n-channel TFT of the pixel TFT. Using the gate electrodes 118 through 122 as a mask, the impurity element that imparts n-type is doped by ion doping in a self-aligning manner. The concentration of phosphorous (P), as the impurity element imparting n-type, is doped at a concentration range from $1 \times 10^{16}$ to $5 \times 10^{19}$ atoms/cm³. Low concentration n-type impurity regions 124 to 129 are thus formed in the island-like semiconductor film as shown in FIG. 5B.

Then, the step of forming a high concentration n-type impurity region (n⁺ doping step) to function as a source region or a drain region in the n-channel TFT is performed. First, resist masks 130 through 134 are formed by using a photomask 3 (PM3), then an impurity element that imparts n-type is doped to thereby form the high concentration n-type impurity regions 135 through 140. Phosphorous (P) is used as the impurity element imparting n-type. Ion doping using phosphine ($PH_3$) is performed so that the concentration of phosphorous will be in the concentration range from $1 \times 10^{20}$ to $1 \times 10^{21}$ atoms/cm³. (FIG. 5C)

Next, high concentration p-type impurity regions 144 and 145 are formed as a source region and a drain region in the island-like semiconductor films 104 and 106 that form the p-channel TFT. Using the gate electrodes 118 and 120 as masks, an impurity element that imparts p-type is doped to thereby form the high concentration p-type impurity region in a self-aligning manner. At this point, the island-like semiconductor films 105,107, and 108, which form the n-channel TFT, covers the entire surface of resist masks 141 through 143 formed by using a photomask 4 (PM4). High concentration p-type impurity regions 144 and 145 are formed by ion doping using diborane ($B_2H_6$). The boron (B) concentration in this region is set to be between $3 \times 10^{20}$ and $3 \times 10^{21}$ atoms/cm³. (See FIG. 5D)

In a previous step, phosphorous has been doped into the high concentration p-type impurity regions 144 and 145. Accordingly, the high concentration p-type impurity regions 144a and 145a have a concentration of between $1 \times 10^{20}$ and $1 \times 10^{21}$ atoms/cm³ and the high concentration p-type impurity regions 144b and 145b have a concentration of between $1 \times 10^{16}$ and $5 \times 10^{19}$ atoms/cm³. By doping boron (B) at a concentration of 1.5 to 3 times that of phosphorous in this step, there are no problems as to functioning as a source region and a drain region of the p-channel TFT.

Figure 6A:
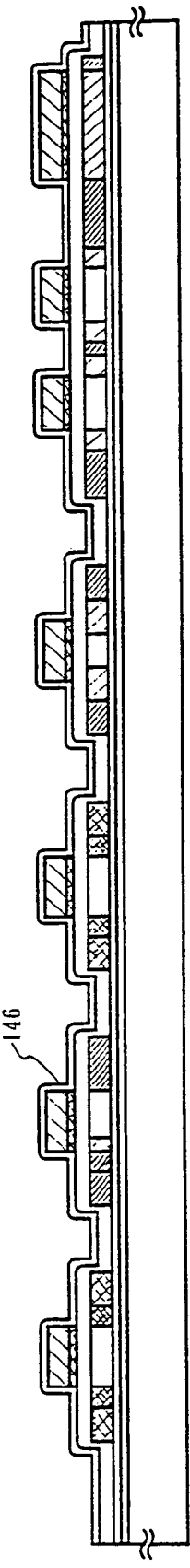
FIGS. 6A-6C are cross sectional views showing the steps of a method of manufacturing a pixel TFT and a TFT for a driving circuit.

Thereafter, as shown in FIG. 6A, a protective insulating film 146 is formed from above the gate electrode and the gate insulating film. The protective insulating film may comprise a silicon oxide film, a silicon oxynitride film, a silicon nitride film or a laminate film of the combination of these films. In any case, the protective insulating film 146 is formed of an inorganic insulating material. The protective insulating film 146 has a film thickness of 100 to 200 nm. When the silicon oxide film is used, the film may be formed by plasma CVD, mixing tetraethyl orthosilicate (TEOS) and $O_2$, and setting the reaction pressure at 40 Pa, the substrate temperature of 300 to 400° C. and discharging at a high frequency (13.56 MHz), electric power density of 0.5 to 0.8 W/cm². When the silicon oxynitride film is used, a silicon oxynitride film formed from $SiH_4$, $N_2O$ and $NH_3$ by plasma CVD or a silicon oxynitride film formed from $SiH_4$ and $N_2O$ by plasma CVD may be formed. The deposition condition in this case is the reaction pressure of 20 to 200 Pa, the substrate temperature of 300 to 400° C., and the high frequency (60 MHz) electric power density of 0.1 to 1.0 W/cm$^2$. The hydrogenated silicon oxynitride film formed from SiH$_4$, N$_2$O and H$_2$ may be used, as well. The silicon nitride film can be formed similarly from SiH$_4$ and NH$_3$ by plasma CVD.

Figure 6B:
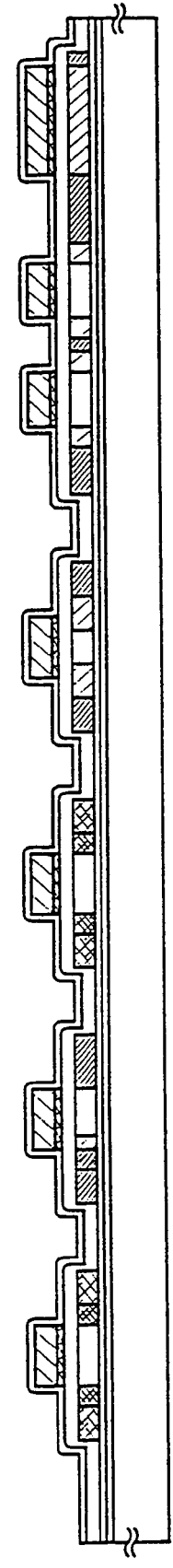

Thereafter, the step for activating the impurity elements imparting n-type or p-type added in the respective concentrations is conducted. This step is conducted by a thermal annealing method using a furnace annealing oven. Besides the thermal treatment using laser light may be used for activating the impurity elements. Thermal treatment condition in this case is the same as that mentioned above. In the case of using the thermal annealing method, it is performed in a nitrogen atmosphere containing oxygen in a concentration of 1 ppm or less, preferably 0.1 ppm or less, at 400 to 700° C., typically 500 to 600° C. In this embodiment, the heat-treatment is conducted at 550° C. for 4 hours. When a plastic substrate having a low heat-resistant temperature is used for the substrate 101, the heat treatment method using laser light of the present invention is preferably employed (FIG. 6B).

After the heat treatment, another heat-treatment is further conducted in an atmosphere containing 3 to 100% hydrogen at 300 to 450° C. for 1 to 12 hours to hydrogenate the island-like semiconductor films. This is the process step that terminates the dangling bonds of $10^{16}$ to $10^{18}$/cm$^3$ in the island-like semiconductor film by hydrogen that is thermally excited. Plasma hydrogenation (using hydrogen that is excited by plasma) may be used as another means for hydrogenation.

Figure 3:
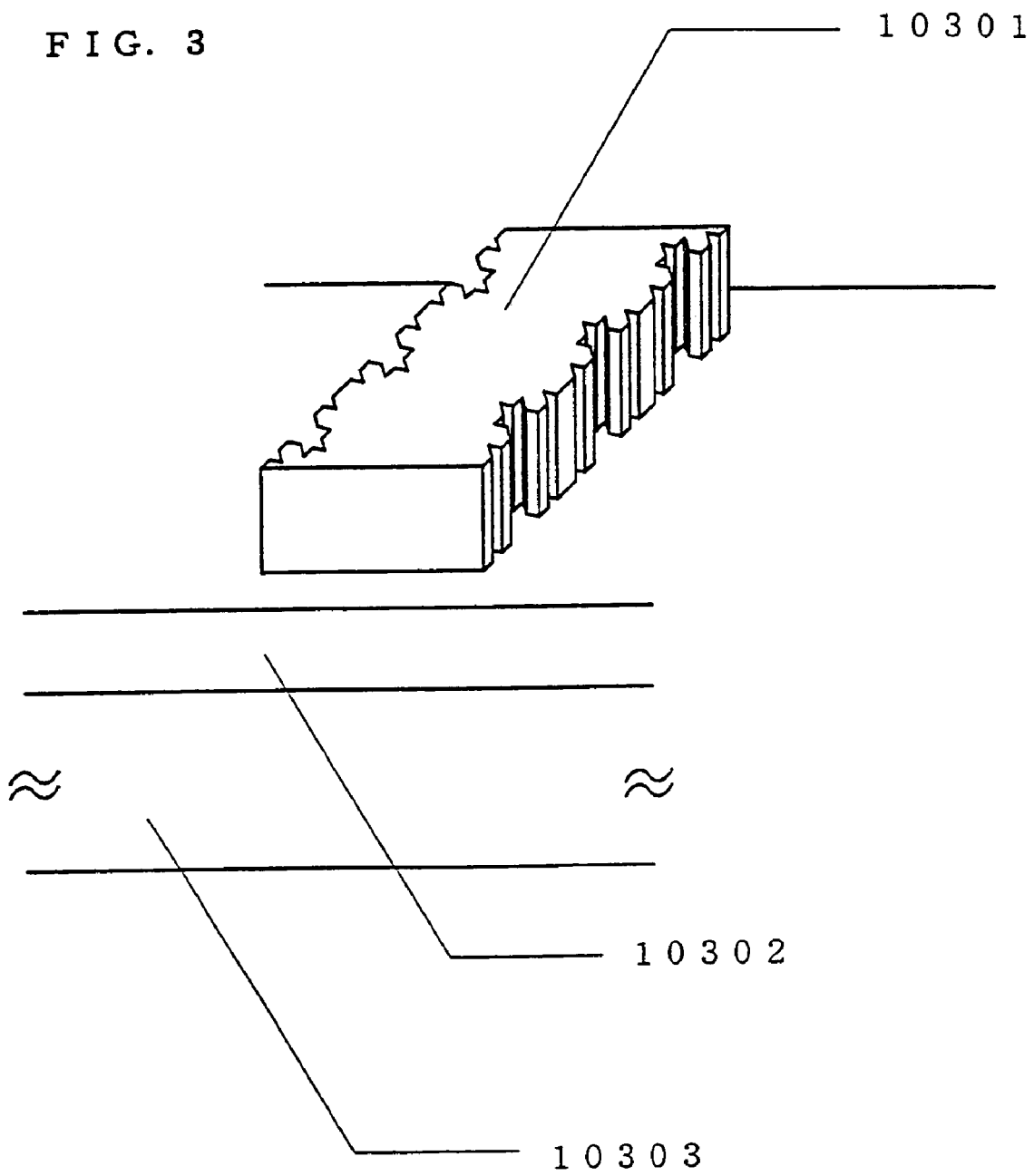
FIG. 3 is a schematic view showing the island-like structure of a semiconductor thin film and a silicon oxide film which is formed during gettering of the present invention.

In the case of combining the heat treatment method using laser light of the present invention with the plasma hydrogenation treatment, the device having a structure shown in FIG. 3 can be used. Specifically, the heat treatment using laser light is performed in the treatment chamber 818, and thereafter the substrate is moved to the treatment chamber 816 through a transporting means 820 to perform plasma hydrogenation. The plasma hydrogenation can be facilitated by introducing hydrogen gas or ammonia gas into the treatment chamber 816. In this way, the substrate is kept inside the device to be treated continuously without being exposed to the air, thereby preventing contamination of the surface of the substrate and improving throughput.

Next, an interlayer insulating film 147 made of an organic insulating material is formed to an average thickness of 1.0 to 2.0 μm. Examples of the organic resin materials include polyimide, acrylic, polyamide, polyimidamide, BCB (benzocyclobutene), and so forth. When polyimide of the type, which is thermally polymerized after being applied to the substrate, is used, the material is baked at 300° C. in a clean oven. When acrylic is used, a two-component type is used. After the main agent and the curing agent are mixed, the mixture is applied to the entire surface of the substrate by using a spinner. Preparatory heating is then conducted by using a hot plate at 80° C. for 60 seconds, and baking is then made in the clean oven at 250° C. for 60 minutes.

By forming the interlayer insulating film from the organic insulating material, its surface can be planarized satisfactorily. The organic resin materials have generally a low dielectric constant, and the parasitic capacitance can be reduced. However, since they are hygroscopic, they are not suitable for the protective film. Therefore, the organic insulating material must be used in combination with the silicon oxide film, the silicon oxide nitride film or the silicon nitride film formed as the protective insulating film 146 as in this embodiment.

Thereafter, a resist mask having a prescribed pattern is formed by using a photomask 5 (PM5), and contact holes reaching the source or drain regions of the respective island-like semiconductor films are formed. The contact holes are formed by dry etching. In this case, a mixed gas of CF$_4$, O$_2$ and He is used as the etching gas to first etch the interlayer insulating film formed of the organic resin material. The protective insulation film 146 is then etched with etching gases of CF$_4$ and O$_2$. By switching the etching gas further to CHF$_3$ to improve the selection ratio with the island-like semiconductor films, the gate insulating film is etched and the contact holes can be formed satisfactorily.

A conductive metal film is formed by sputtering or vacuum deposition. A resist mask pattern is then formed by using a photomask 6 (PM6). Source wirings 148 to 152 and drain wirings 153 to 157 are formed by etching. Here, the drain wiring 157 functions as a pixel electrode. As not shown in the Figure, in this embodiment, this electrode is formed with Ti film that is formed into 50 to 150 nm thickness, a contact is formed with the semiconductor film that forms source or drain region in the island-like semiconductor film, and aluminum (Al) is formed to a thickness of 300 to 400 nm in superposition with the Ti film to form this wiring.

Figure 6C:
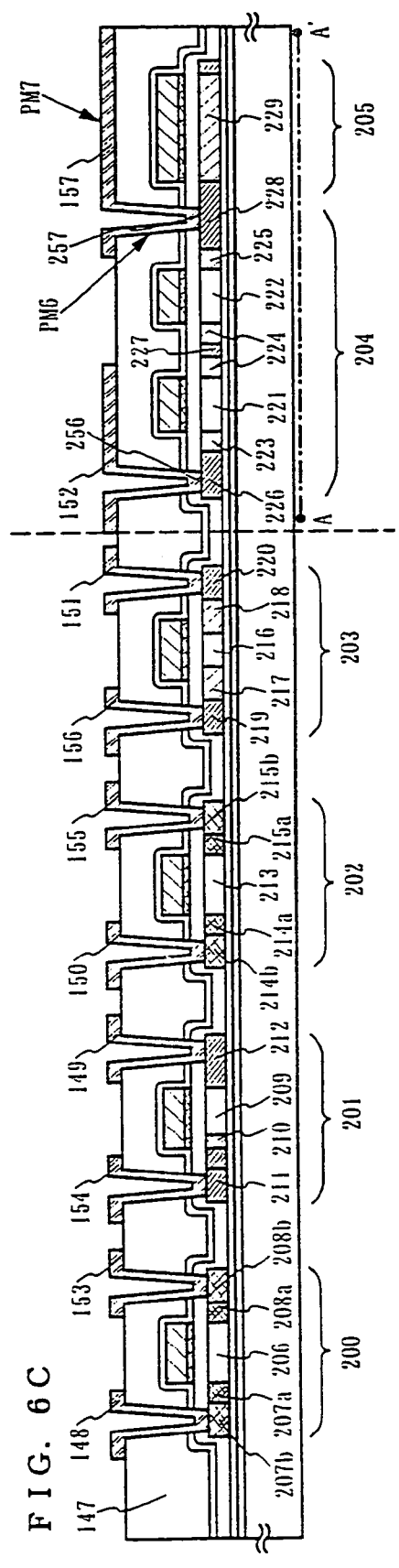

When the hydrogenation treatment is conducted under this state, favorable results can be obtained for the improvement of TFT performance. For example, the heat-treatment is conducted preferably at 300 to 450° C. for 1 to 12 hours in an atmosphere containing 3 to 100% of hydrogen. A similar effect can be obtained by using the plasma hydrogenation method. Such a heat-treatment can diffuse hydrogen existing in the protective insulating film 146 and the base film 102 into the island-like semiconductor films 104 to 108 and can hydrogenate these films. In any case, the defect density in the island-like semiconductor films 104 to 108 is lowered preferably to $10^{16}$/cm$^3$ or below, and for this purpose, hydrogen may be added in an amount of about 0.01 to about 0.1 atomic % (FIG. 6C).

Thus a substrate having the TFTs of the driving circuit and the pixel TFTs of the pixel section over the same substrate can be completed by using seven photomasks. The first p-channel TFT 200, the first n-channel TFT 201, the second p-channel TFT 202 and the second n-channel TFT 203 are formed in the driving circuit. The pixel TFT 204 and the storage capacitance 205 are formed in the pixel section. In this specification, such a substrate will be referred to as an active matrix substrate for convenience sake.

The first p-channel TFT 200 in the driving circuit has a single drain structure, which has in the island-like semiconductor film 104: the channel formation region 206; and the source regions 207a and 207b and the drain regions 208a and 208b each comprising the p-type impurity region having the high concentration. The first n-channel TFT 201 has in the island-like semiconductor film 105: the channel forming region 209; the LDD region 210 that overlaps with the gate electrode 119; and the source region 212 and the drain region 211. The LDD region that overlaps the gate electrode 119 is referred to as Lov here, and the length of this region in the direction of the channel length is 0.5 to 3.0 μm, preferably 1.0 to 2.0 μm. As the length of the LDD region in the n-channel TFT is determined in this way, a high electric field generated in the vicinity of the drain region can be mitigated, and the occurrence of hot carriers and degradation of the TFT can be prevented. The second p-channel TFT 202 in the driving circuit has similarly the single drain structure including the channel forming region 213, the source regions 214a and 214b and the drain regions 215a and 215b comprising the p-type impurity region having the high concentration, in the island-like semiconductor film 106. A channel forming region 216; LDD regions 217 and 218 that partly overlap the gate electrode 121; and a source region 220 and a drain region 219; are formed in the island-like semiconductor film 107 in the second n-channel TFT 203. The length of the Lov that overlaps the gate electrode of this TFT, too, is also set to 0.5 to 3.0 μm, preferably from 1.0 to 2.0 μm. Further, a LDD region that does not overlap the gate electrode is referred to as an Loff region, and its length in the channel length direction is 0.5 to 4.0 μm, preferably 1.0 to 2.0 μm. The pixel TFT 204 has in the island-like semiconductor film 108: channel forming regions 221 to 222; and LDD regions 223 to 225; and source or drain regions 226 to 228. The length of the LDD region (Loff) in the direction of the channel length is 0.5 to 4.0 μm, preferably 1.5 to 2.5 μm. Furthermore, a storage capacitance 205 comprises a capacitance wiring 123, an insulating film made of the same material as the gate insulating film and a semiconductor film 229 that is connected to the drain region 228 of the pixel TFT 204. In FIG. 6C, the pixel TFT 204 is shown as having a double gate structure. However, it may have a single gate structure or a multi-gate structure having a plurality of gate electrodes.

Figure 16:
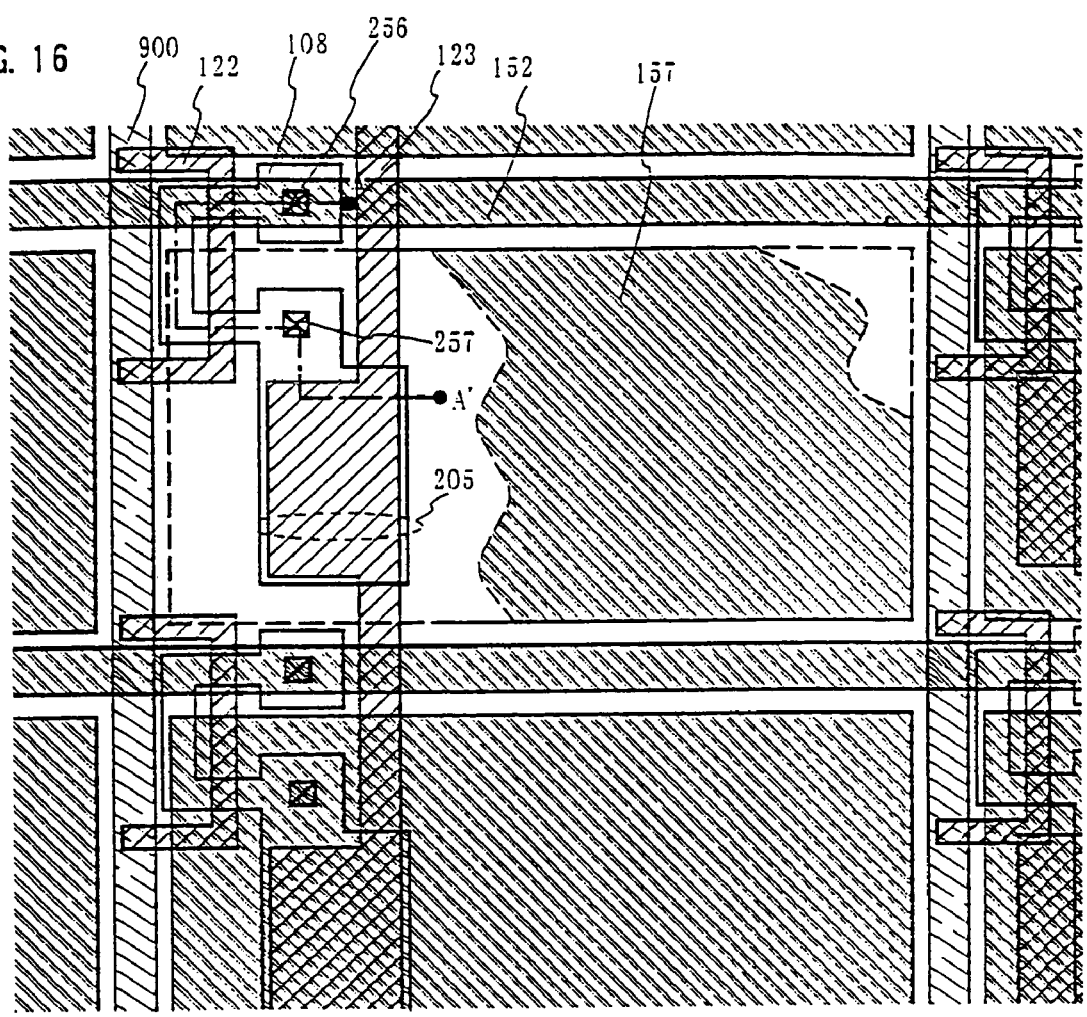
FIG. 16 is a top plan view showing a pixel of a pixel part.

FIG. 16 shows a top view illustrating substantially the whole area corresponding to one pixel in the pixel section. The cross-sectional view of the pixel section shown in FIG. 6C is taken along the line A-A' indicated in FIG. 16. The gate electrode 122 of a pixel TFT 204 crosses the underlying island-like semiconductor film 108 via a gate insulating film (not illustrated). Further, the gate electrode 122 contacts the gate wiring 900 made from low resistant conductive material formed by using materials such as Al, Cu, or the like outside of the island-like semiconductor film 108 not through contact hole. Although not illustrated, in the island-like semiconductor film 108, the source region, the drain region, and the LDD region are provided. In addition, reference numeral 256 designates a contact portion between a source wiring 152 and the source region 226, while 257 designates a contact portion between a drain wiring 157 and the drain region 228. The storage capacitance 205 is formed in the region in which a semiconductor film 229 extending from the drain region 228 of the pixel TFT 204 overlaps a capacitance wiring 123 via the gate insulating film. In the above structure, no impurity elements intended for controlling valence electrons are added into the semiconductor film 229.

The above-described structure allows the structures of the respective TFTs to be optimized based on specification required in the pixel TFT and the driver circuit, and further allows the operating performances and the reliability of the semiconductor device to be improved. Moreover, by forming a gate electrode with a conductive material having the heat-resistance capability, activation of the LDD region or the source/drain regions can be easily performed. To manufacture an active matrix substrate on which TFTs are provided, heat treatment method using laser light of the present invention and laser device are employed, thereby good characteristic TFTs can be fabricated and productivity can be improved. A liquid crystal display device and an EL display device can be manufactured by using such an active matrix substrate.

Embodiment 2

Examples of using heat-resistant conductive materials such as W and Ta as materials for the gate electrode of the TFT were shown in Embodiment 1. The reason for using these materials resides in various factors that it is necessary to activate the impurity element that was doped into the semiconductor film for the purpose of controlling valence electrons after the formation of the gate electrode by thermal annealing at between 400° C. and 700° C., to-prevent electromigration, and to improve the corrosion resistance. However, this type of heat-resistant conductive material has a sheet resistivity of about 10Ω, and hence is not always suitable for a liquid crystal display device or an EL display device having a screen size of a 4-inch class or more. This is because if a gate wiring to be connected to the gate electrode is formed of the same material, then the length of the lead wiring on the substrate inevitably becomes long. Thus, the problem of a delay time caused by the influence of wiring resistance cannot be ignored.

For example, 480 gate wirings and 640 source wirings are formed when the pixel density is VGA, and 768 gate wirings and 1024 source wirings are formed in the case of XGA. The screen size of the display region becomes 340 mm for a 13-inch class in diagonal length, and becomes 460 mm for an 18-inch class. In this embodiment, as a means of realizing this kind of liquid crystal display device, a method of forming the gate wiring from low-resistant conductive materials such as Al and copper (Cu) will be explained using FIG. 7.

Figure 7A:
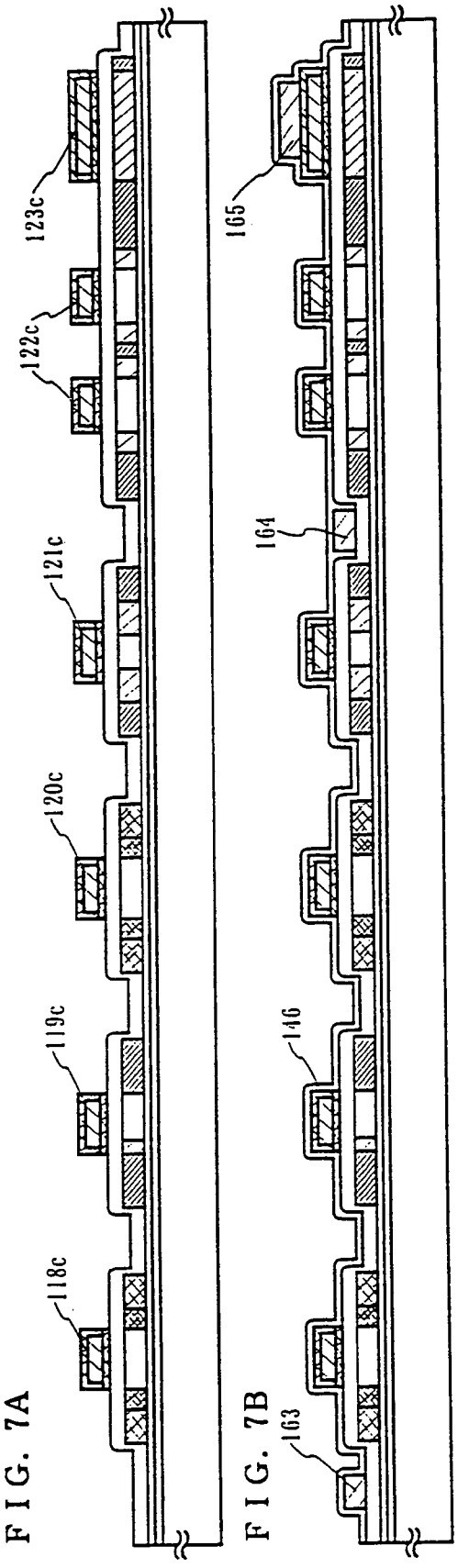
FIGS. 7A-7C are cross sectional views showing the steps of a method of manufacturing a pixel TFT and a TFT for a driving circuit.
Figure 7B:
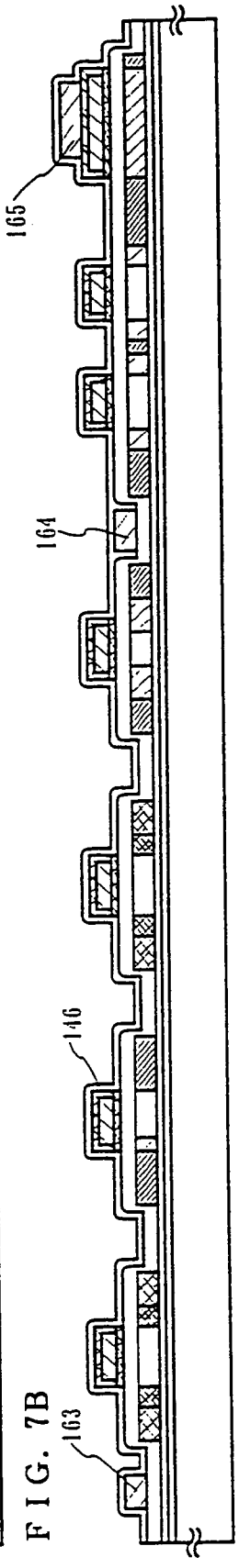

First, similar to Embodiment 1, the steps shown in FIGS. 4A to 5D will be performed. Then, a step of activating the impurity element doped into the respective island-like semiconductor film for the purpose of controlling valence electron is performed. Heat treatment method using laser light is most suitable for the activation treatment. Further, heat treatment is conducted in an atmosphere containing 3 to 100% hydrogen at 300 to 450° C. for 1 to 12 hours to hydrogenate the island-like semiconductor films. This is the process step that terminates the dangling bonds of the semiconductor films by hydrogen that is thermally excited. Plasma hydrogenation (using hydrogen that is excited by plasma) may be used as another means for hydrogenation. (FIG. 7A)

After the activation and hydrogenation steps are completed, a gate wiring is formed from a low-resistant conductive material. The low-resistant conductive layer is formed of a conductive layer (D) comprising aluminum (Al) or copper (Cu) as a main component. For example, an aluminum film containing between 0.1 and 2% by weight of titanium (Ti) is formed as the conductive layer (D) on the entire surface (not shown). The conductive layer (D) 145 may be formed with a thickness of 200 to 400 nm (preferably 250 to 350 nm). Then, a predetermined resist pattern is formed using a photomask, the conductive layer is etched in order to form gate wirings 163 and 164, and a capacitor wiring 165. The conductive layer (D) is removed by wet etching using a phosphoric acid-based etching solution, the gate wiring can be formed while maintaining the selective workability with the base. A protective insulating film 146 is formed. (See FIG. 7B)

Figure 8A:
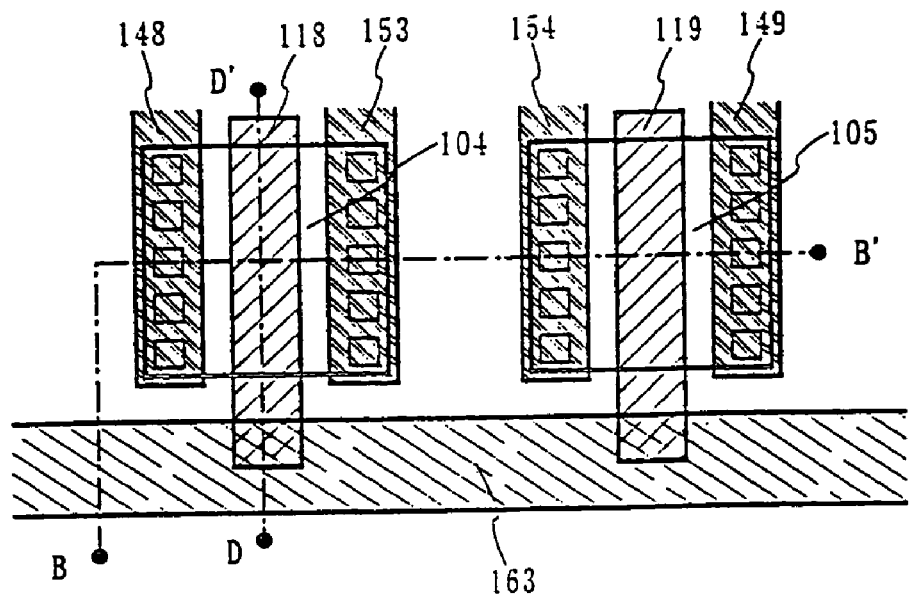
FIGS. 8A-8B are top plan views showing the structure of a TFT for a driving circuit and a pixel TFT.
Figure 8B:
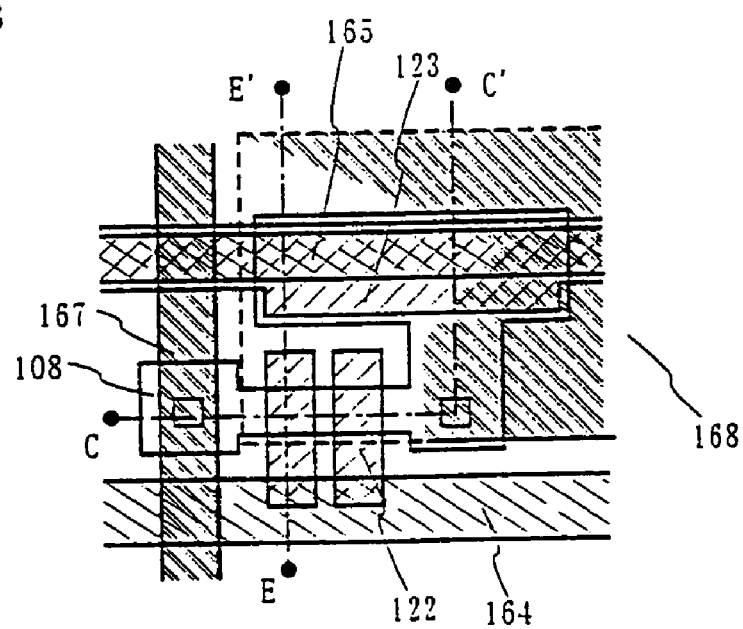
Figure 9A:
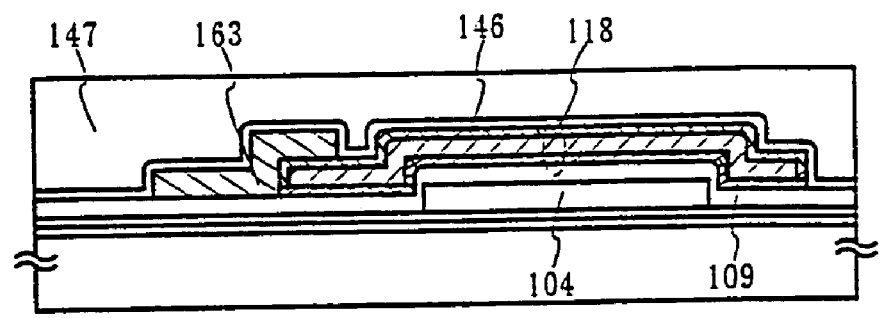
FIGS. 9A-9B are cross sectional views showing the structure of a TFT for a driving circuit and a pixel TFT.
Figure 9B:
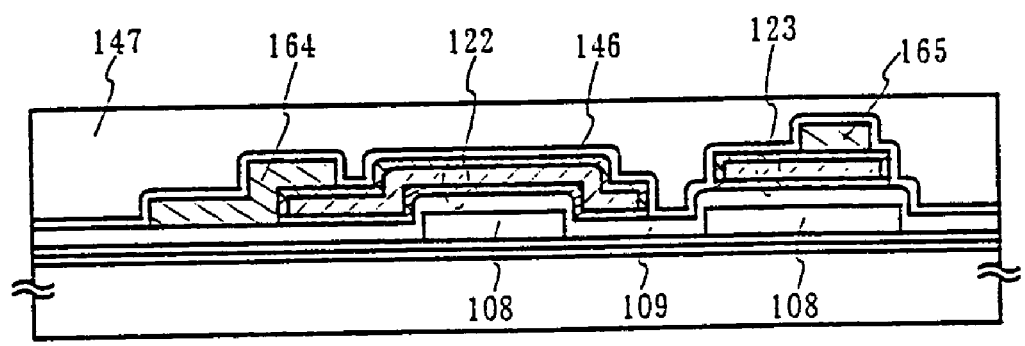

Thereafter, similar to Embodiment 1, by forming an interlayer insulating film 147 made of an organic insulating material, source wirings 148 to 151 and 167, and drain wirings 153 to 156 and 168, the active matrix substrate can thus be completed. FIGS. 8A and 8B show top views of this state, and the cross sections taken along the line B-B' of FIG. 8A and the line C-C' of FIG. 8B correspond to the A-A' and C-C' cross sections, respectively, in FIG. 7C. Although the gate insulating film, the protective insulating film, and the interlayer insulating film are omitted from the FIGS. 8A and 8B, the source and drain regions of the island-like semiconductor films 104, 105, and 108 not shown in the figure are connected to the source wirings 148, 149 and 167, and drain wirings 153, 154, and 168 through contact holes. Further, the cross sections taken along the line D-D' of FIG. 8A and the line E-E' of FIG. 8B are shown in FIGS. 9A and 9B, respectively. The gate wiring 163 is formed overlapping the gate electrodes 118, 119 and the gate wiring 164 is formed overlapping the gate electrode 122 in the outside of the island-like semiconductor films 104, 105 and 108. Thus, the conductive layer (C) and the conductive layer (D) are in close contact to be electrically communicated. By forming the gate wiring from a low-resistant conductive material in this way, the wiring resistance can be sufficiently reduced. Accordingly, the present invention can be applied to a liquid crystal display device or an EL display device that has a pixel section (screen size) of 4-inch class or more.

Embodiment 3

Figure 10:
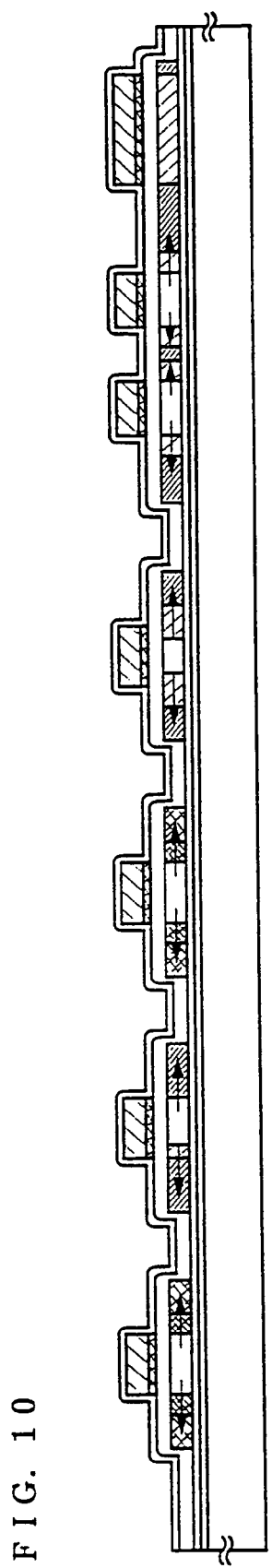
FIG. 10 is a cross sectional view showing the step of a method of manufacturing a pixel TFT and a TFT for a driving circuit.

The active matrix substrate manufactured in Embodiment 1 is applicable for a reflection type liquid crystal display device as it is. On the other hand, in the case of applying it to a transmission type liquid crystal display device, it is appropriate to form the pixel electrodes provided in each pixel of the pixel section with transparent electrodes. A method of manufacturing an active matrix substrate corresponding to the transmission type liquid crystal display device is explained in Embodiment 3 with references to FIG. 10.

Figures 11A, 11B:
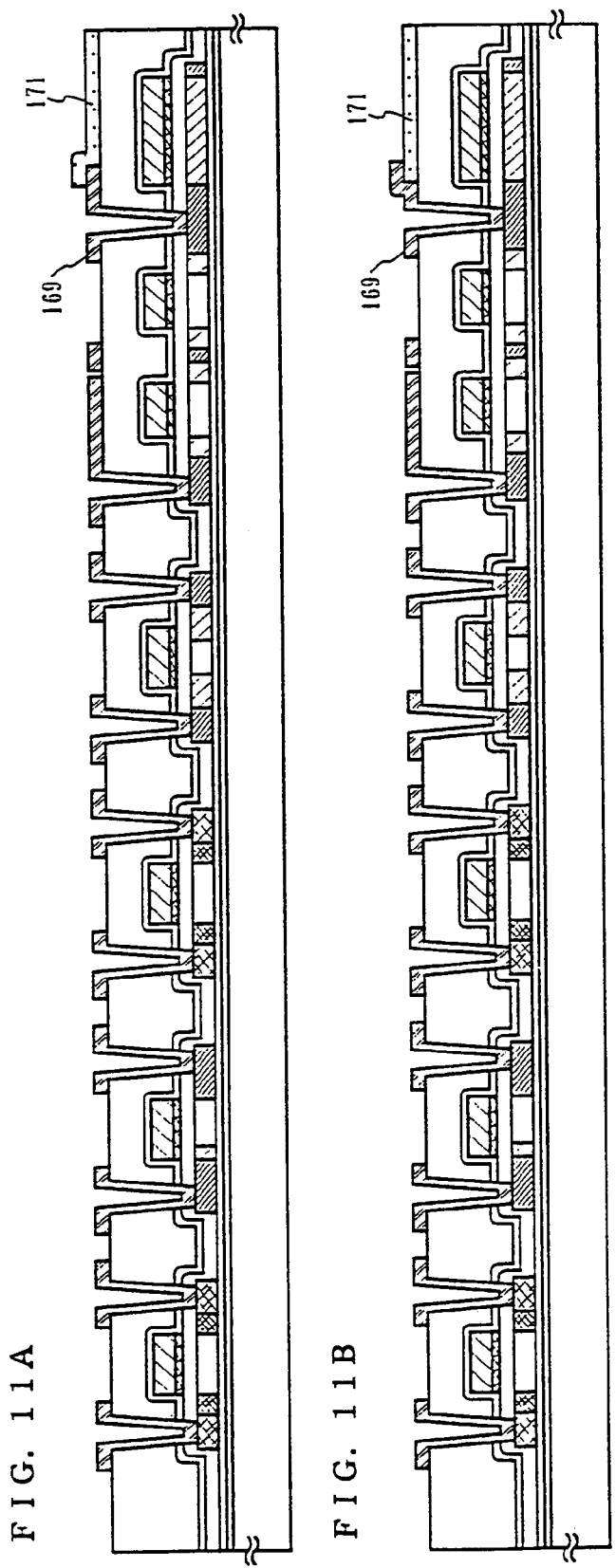
FIGS. 11A-11B are cross sectional views showing the steps of a method of manufacturing a pixel TFT and a TFT for a driving circuit.

The active matrix substrate is manufactured in the same way as Embodiment 1. In FIG. 11A, a conductive metallic film is formed by sputtering or vacuum evaporation to form a source wiring and a drain wiring. A Ti film is formed at a thickness of between 50 and 150 nm, and then a contact is formed with a semiconductor film that forms the source region or the drain region in an island-like semiconductor film. Next, an aluminum (Al) film is formed at a thickness of between 300 and 400 nm overlapping on the Ti film. Further, a Ti film or a titanium nitride (TiN) film is formed at a thickness of between 100 and 200 nm to thereby form a three-layer structure. Then a transparent conductive film is formed on the entire surface. A pixel electrode 171 is formed by a patterning treatment and an etching treatment, using a photomask. The pixel electrode 171 is formed on an interlayer insulating film 147 and sets aside a portion for overlapping with the drain wiring 169 of the pixel TFT 204 in order to form a connection structure.

FIG. 11B is an example of first forming a transparent conductive film on the interlayer insulating film 147, performing a patterning treatment and an etching treatment to form a pixel electrode 171, and then forming a drain wiring 169 by a portion that overlaps with the pixel electrode 171. The drain wiring 169 is provided by forming a Ti film at a thickness of between 50 and 150 nm, forming a contact with a semiconductor film that forms the source region or the drain region in an island-like semiconductor film, and then forming an aluminum (Al) at a thickness of between 300 and 400 nm overlapping on the Ti film. With this structure, the pixel electrode 171 is in contact only with the Ti film that forms the drain wiring 169. Consequently, the transparent conductive film material and Al reacting from direct contact can definitely be prevented.

Materials such as indium oxide ($In_2O_3$), or an indium oxide/tin oxide alloy ($In_2O_3$—$SnO_2$; ITO) formed by sputtering or vacuum evaporation may be used as materials for the transparent conductive film. The etching treatment of these materials is performed with hydrochloric acid solutions. However, in particular, the etching of ITO readily generates residues. Therefore, an indium oxide/zinc oxide alloy ($In_2O_3$—ZnO) may be used in order to improve the etching workability. The indium oxide/zinc oxide alloy has excellent flat and smooth surface properties, and also has excellent thermal stability with regard to ITO. Accordingly, at an edge surface of a drain wiring 169 where the Al comes into contact, corrosion reaction with Al can be prevented. Similarly, zinc oxide (ZnO) is also a suitable material. In order to further improve the transmissivity of visible light and conductivity, zinc oxide (ZnO: Ga) doped with gallium (Ga) or the like may be used.

In this way, an active matrix substrate corresponding to the transmission type liquid crystal display device can be completed. Though the steps of described in this embodiment are similar to those in Embodiment 1, this kind of structure can be applied to the active matrix substrate shown in Embodiment 2.

Embodiment 4

Figure 12A:
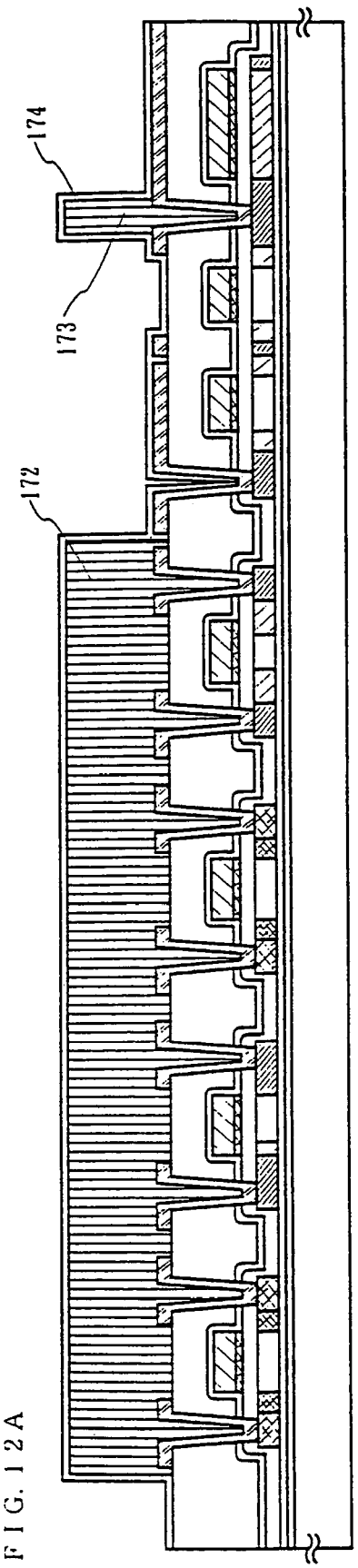
FIGS. 12A-12B are cross sectional views showing the steps of a method of manufacturing an active matrix liquid crystal display device.

A process of manufacturing an active matrix liquid crystal display device from the active matrix substrate fabricated in Embodiment 1 will be explained here in Embodiment 4. As shown in FIG. 12A, first a spacer made from a column-shape spacer is formed on the active matrix substrate in the state of FIG. 6C. The spacer may be provided by a method of spraying several μm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. The shape of the column-shape spacer 173 becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height is set between 1.2 and 5 μm, the average radius is set between 5 and 7 μm, and the ratio of the average radius and the radius of the bottom portion is set to 1 to 1.5. The taper angle of the side surface at this point is ±15° or less.

The arrangement of the column-shape spacers may be arbitrarily determined, but preferably it is appropriate to form a column-shape spacer 168 overlapping the contact area 235 of the drain wiring 161(pixel electrode) in the pixel section so as to cover that overlapped portion as shown in FIG. 12A. Liquid crystal cannot be smoothly oriented in a portion where the levelness of the contact area 235 has been ruined. Hence, the column-shape spacer 168 is formed as in the form of filling the contact area 235 with resin used for the spacer, whereby disclination or the like can be prevented.

Thereafter, an orientation film 174 is formed. A polyimide resin is generally used for the orientation film of a liquid crystal display device. After forming the orientation films, a rubbing treatment is performed so that the liquid crystal molecules are oriented with a certain fixed pre-tilt angle. The rubbing treatment is performed so that an area of 2 μm or less from the edge portion of the column-shape spacer 173 provided in the pixel section to the rubbing direction, is not rubbed. Further, since the generation of static electricity from the rubbing treatment is often a problem, an effect of protecting the TFT from the static electricity can be attained by forming the spacer 172 formed on the TFT of the driver circuit.

Figure 12B:
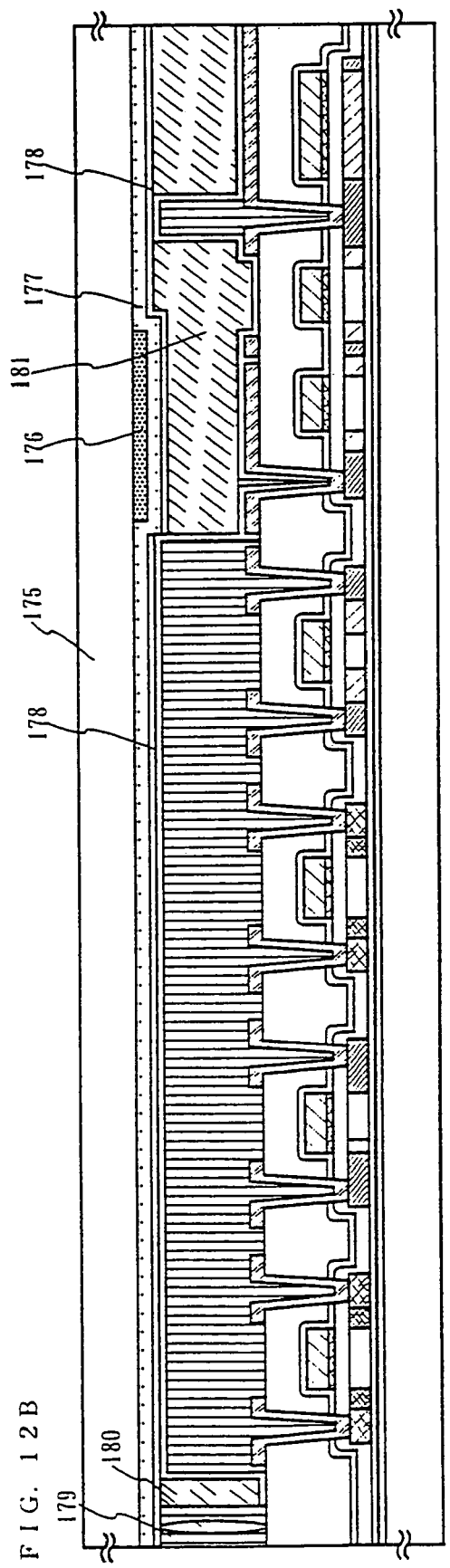

A light shielding film 176, a transparent conductive film 177, and an orientation film 178 are formed on an opposing substrate 175. The light shielding film 176 is formed of films such as a Ti film, a Cr film, and an Al film at a thickness of between 150 and 300 nm. Then, the active matrix substrate on which the pixel section and the driver circuit are formed, and the opposing substrate are then joined together by a sealant 179. A filler 180 is mixed into the sealant 179, and the two substrates are joined together with a uniform spacing by the filler 180 and the spacers 172 and 173. Next, a liquid crystal material 606 is injected between both substrates and completely sealed with a sealant (not shown in the figure). A known liquid crystal material may be used as the liquid crystal material. In this way, the active matrix type liquid crystal display device shown in FIG. 12B is completed.

Figure 13:
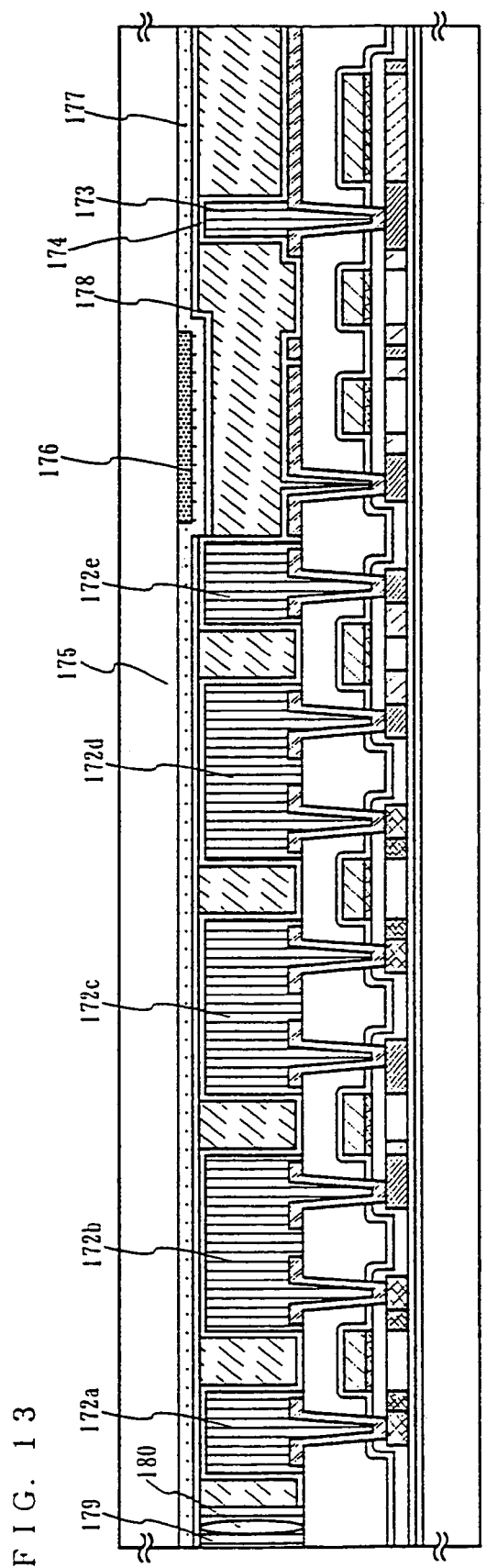
FIG. 13 is a cross sectional view showing the structure of an active matrix liquid crystal display device.

FIG. 12 shows the example where the spacer 172 is formed on the entire surface of the TFT of the driving circuit. However, the spacer may be divided into a plurality of segment spacers 172a to 172e as shown in FIG. 13. The spacer that is to be disposed at the formation portion of the driving circuit may be formed in such a manner as to cover at least the source and drain wirings of the driving circuit. According to this construction, each TFT of the driving circuit is completely covered and protected by the protective insulating film 146, the interlayer insulating film 147 and the spacer 172 or the spacers 172a to 172e.

Figure 14:
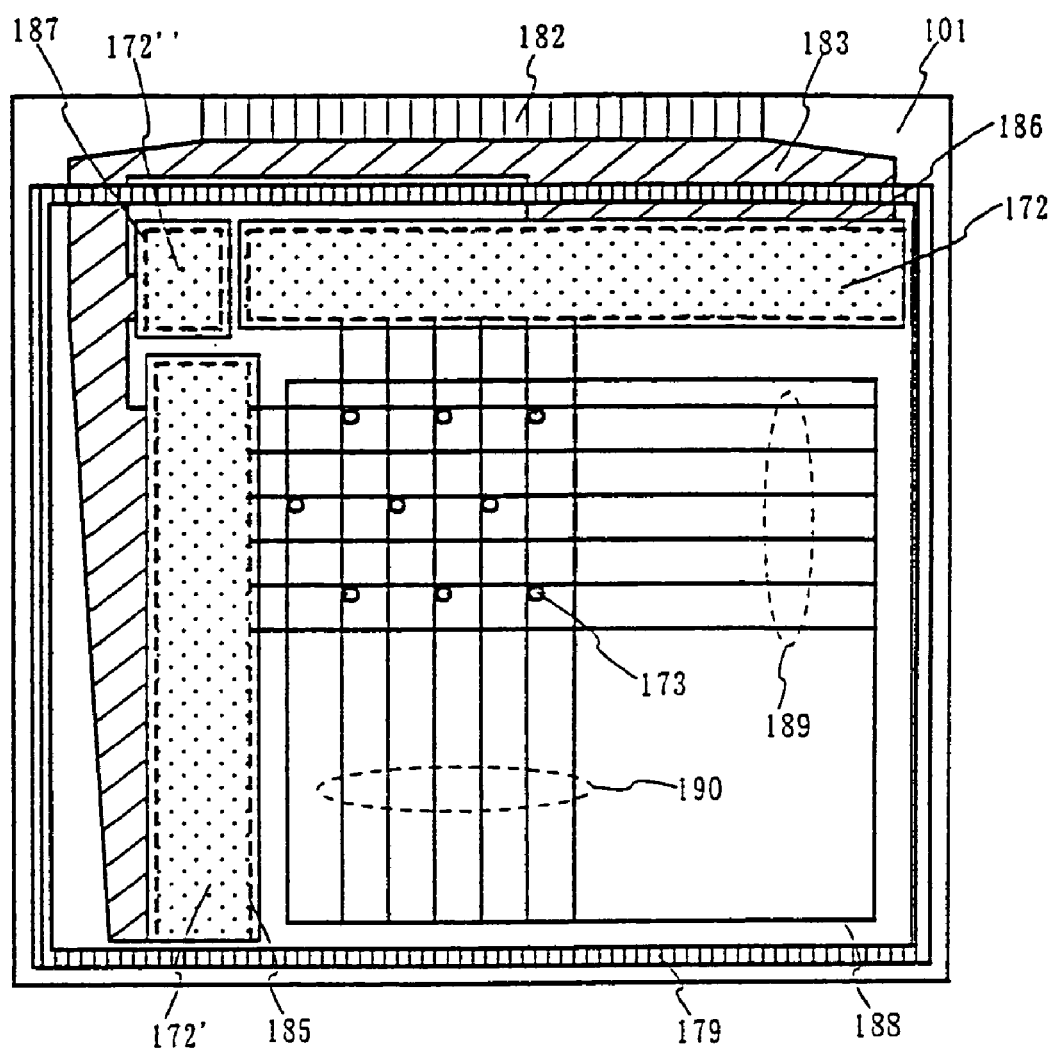
FIG. 14 is a top plan view explaining the arrangement of an input terminal, a wiring, circuits, a spacer, and sealing agent of the liquid crystal display device.

FIG. 14 is a top view of the active matrix substrate on which the spacer and the sealing materials are formed. It is the top view showing the positional relationship among the pixel section, the driving circuit portion, the spacer and the sealant. A scanning signal driving circuit 185 and an image signal driving circuit 186 are disposed as the driving circuit in the periphery of the pixel section 188. A signal processing circuit 187 such as a CPU, a memory, etc, may be further added. These driving circuits are connected to external input/output terminals 182 by a connection wiring 183. In the pixel section 188, a group of gate wiring 189 extending from the scanning signal driving circuit 185 and a group of source wiring 190 extending from the image signal driving circuit 186 cross one another in a matrix form. A pixel TFT 204 and a storage capacitance 205 are provided to each pixel.

The columnar spacer 173 disposed in the pixel section may be provided to all the pixels, and may be provided to every several or dozens of pixels disposed in a matrix form. In other words, the proportion of the number of spacers to the total number of pixels constituting the pixel section may be preferably 20 to 100%. The spacers 172, 172' and 172" provided to the driving circuit portion may be disposed so as to cover the entire surface of the driving circuit portion, or may be divided into several segments in match with the positions of the source and drain wirings of the TFT as shown in FIG. 13. The sealant 179 is applied outside the pixel section 188, the scanning signal driving circuit 185, the image signal driving circuit 186 and other signal processing circuits 187 on the substrate 101 but inside the external input/output terminals 182.

Figure 15:
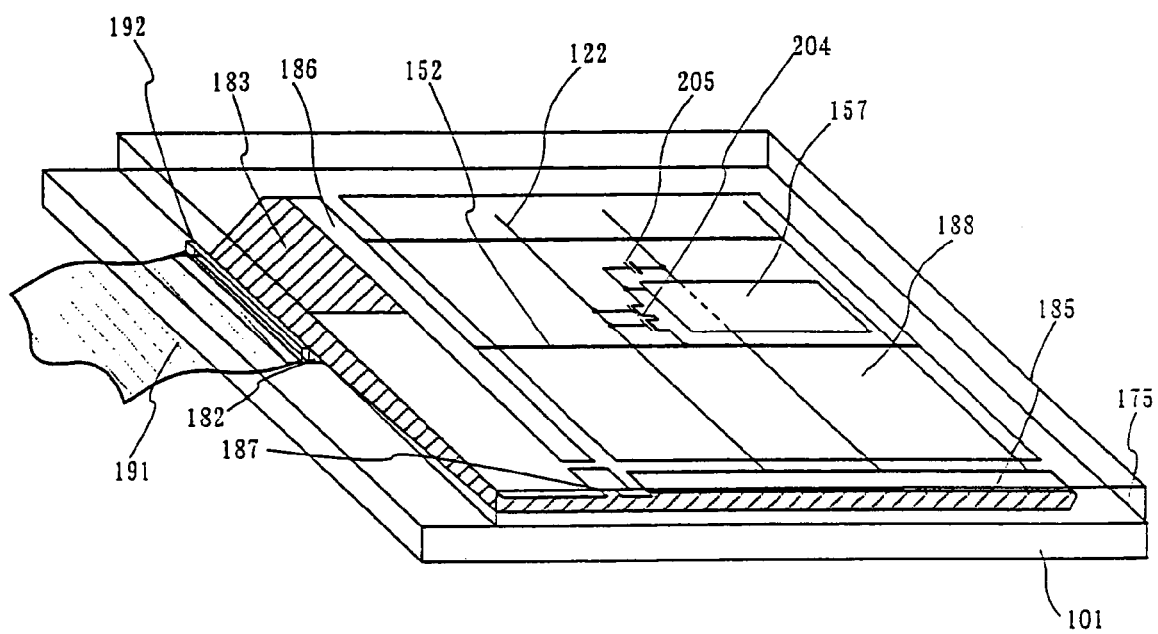
FIG. 15 is a squint view explaining the structure of the liquid crystal display device.

The construction of such an active matrix liquid crystal display device will be explained with reference to the perspective view of FIG. 15. In FIG. 15, the active matrix substrate comprises the pixel section 188, the scanning signal driving circuit 185, the image signal driving circuit 186 and other signal processing circuit 187 formed on the glass substrate 101. The pixel TFT 204 and the storage capacitance 205 are provided to the pixel section 188. The driving circuit disposed in the periphery of the pixel section comprises the CMOS circuit as the basic circuit. The scanning signal driving circuit 185 and the image signal driving circuit 186 are connected to the pixel TFT 204 by the gate wiring 122 and the source wiring 152. A flexible printed circuit (FPC) 191 is connected to the external input terminal 182 and is used for inputting the image signal, and the like. It is connected to the respective driving circuit by connection wiring 183. The shading film and the transparent electrodes, not shown, are disposed on the opposed substrate 175.

The liquid crystal display device having such a construction can be fabricated by using the active matrix substrate shown in Embodiments 1 through 3. When the active matrix substrate of any of Embodiments 1 and 2 is used, a reflection type liquid crystal display device can be obtained. When the active matrix substrate shown in Embodiment 3 is used, a transmission type liquid crystal display device can be obtained.

Embodiment 5

Figure 17A:
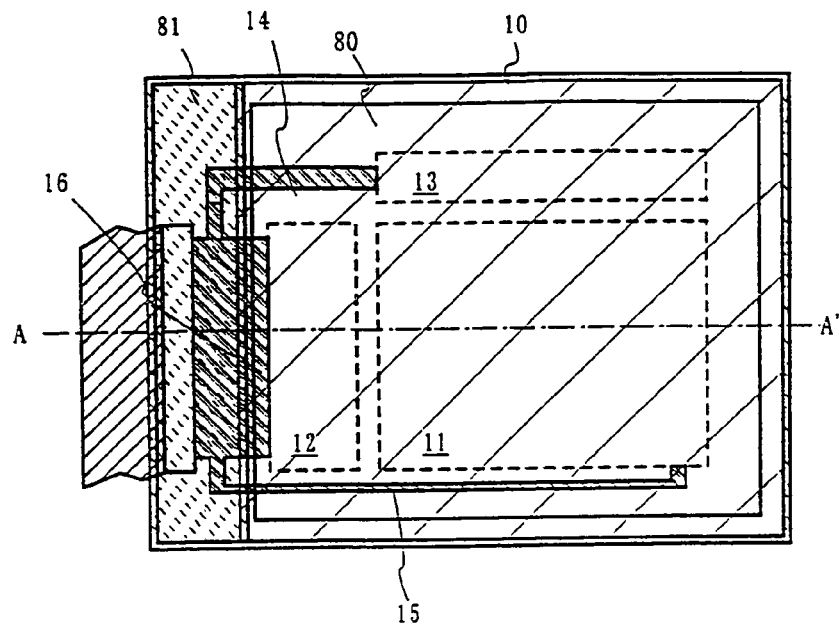
FIGS. 17A-17B are a top plan views of the structure of an EL display device and a cross sectional view.

In this embodiment, an example will be described where a display panel made from an EL (Electro Luminescence) material in a self-emitting type (hereinafter described as EL display device) is formed using an active matrix substrate according to the Embodiment 1. Further, the luminescence includes both light emitting of fluorescence and phosphorescence. In this specification, the electroluminescence includes the light emitting of the either of the two or both. FIG. 17A is a top view of an EL display panel using the present invention. In FIG. 17A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 17B:
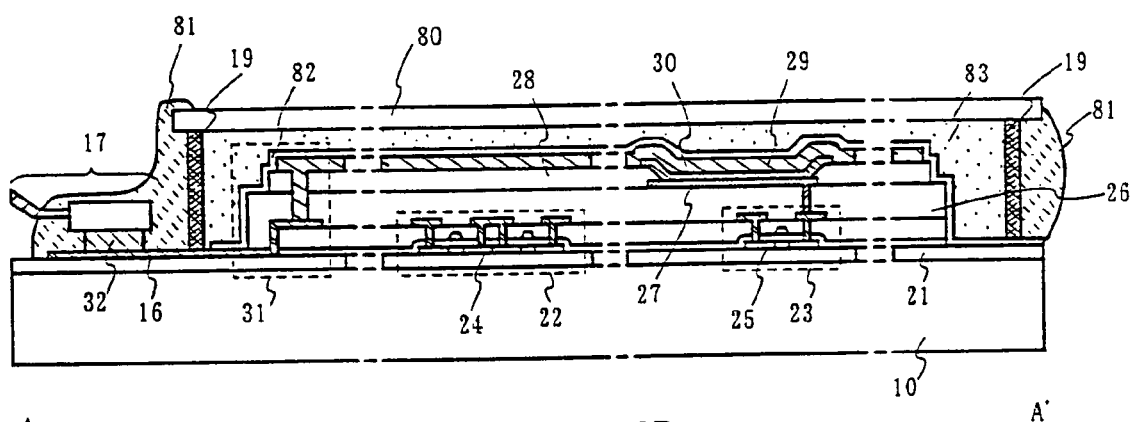

The FIG. 17B shows a sectional structure of A-A' of FIG. 17A. The counter substrate 80 is provided on the surface of the pixel portion, preferably on the driver circuits and the surface of the pixel portion. The counter substrate 80 is attached to the active matrix substrate, on which TFTs and light-emitting layer using the EL material are formed with a sealant 19. The sealant 19 is mixed with a filler (not shown in the figure), two substrate are attached together with the filler at equal spaces. Further, the outside of the sealant 19 and the top surface and the periphery portion of FPC 17 has a structure of being filled up by the sealant 81. As materials of the sealant 81, silicone resin, epoxy resin, phenol resin and butyl rubber are used.

As it is, the active matrix substrate 10 and the counter substrate 80 are attached together with a sealant 19, space is generated therebetween. A filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An light-emitting layer is weak to moisture such as water and is likely to be degraded, so that it is preferable to mix a drying agent such as barium oxide in the filler 83 so as to keep an effect of moisture absorption. Further, a passivation film 82 is formed on the light-emitting layer by the silicon nitride film and silicon oxynitride film to protect from corrosion by alkali element which contains in the filler 83.

A glass plate, an aluminum plate, a stainless steel plate, an FRP (fiberglass-reinforced plastics) plate, a PVF (polyvinyl fluoride) film, a Mylar film (a product of DUPONT Corp.), a polyester film, and an acrylic film or acrylic plate can be used as the counter substrate 80. A sheet having a structure in which several ten µm thick aluminum foil is interposed between a PVF film and a Mylar film, is used to enhance resistance to moisture. In this manner, the EL element is completely sealed and is not exposed to the outside of air.

In FIG. 17B, the TFT 22 for a driving circuit (CMOS circuit which is composed of n-channel type TFT and p-channel type TFT is shown here), and the TFT 23 for a pixel portion (only TFT controlling current to an EL element is shown here) are formed on a substrate 10 and a base film 21. Among these TFTs, in particular, n-channel TFT is provided with an LDD region having the structure shown in the present embodiment so as to prevent the decrease of the on current value due to hot carrier, or the deterioration of the properties caused by Vth shift and bias stress.

For example, as the TFT 22 for a driver circuit, the p-channel TFT 200, 202 or the n-channel TFT 201, 203 shown in FIG. 6C may be used. Furthermore, as the TFT 23 for a pixel portion, a pixel TFT 204 shown in FIG. 6B or a p-channel TFT having a similar structure can be used.

Figure 7C:
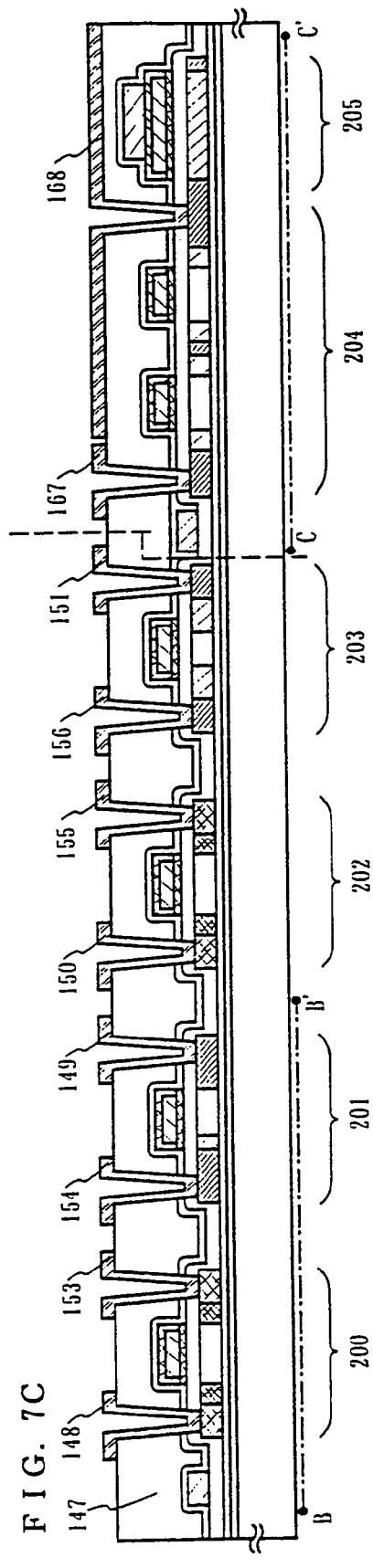

To manufacture the EL display device from an active matrix substrate in a state of FIG. 6C or FIG. 7C, an interlayer insulating film (a flatten film) 26 made of resin material, is formed on the source line and the drain line, and a pixel electrode 27 made of a transparent conductive film, which is connected electrically to drain of the TFT 23 for a pixel portion, is formed thereon. As a transparent conductive film, a compound of indium oxide and tin oxide (which is called as ITO), and a compound of indium oxide and zinc oxide can be used. Then after forming the pixel electrode 27, an insulating film 28 is formed, and an opening portion is formed on the pixel electrode 27.

Next, a light-emitting layer 29 is formed. The light-emitting layer 29 can have a lamination structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

In this embodiment, the light-emitting layer is formed by vapor deposition, ink jet method or dispenser method using a shadow mask. By forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the light-emitting layer 29 is formed, a cathode 30 is formed thereon. It is desirable to remove moisture and oxygen present at an interface between the cathode 30 and the light-emitting layer 29 as much as possible. Thus, it is required to continuously form the light-emitting layer 29 and the cathode 30 in a vacuum, or to form the light-emitting layer 29 in an inactive atmosphere, and form the cathode 30 in a vacuum without exposing the light-emitting layer 29 to the outside air. In this embodiment, a film formation device of a multi-chamber system (cluster tool system) is used to make the above mentioned film formation device possible.

In this embodiment, as the cathode 30, a lamination structure of a LiF (lithium fluoride) film and an Al (aluminum) film is used. More specifically, the LiF film is formed to a thickness of 1 nm on the light-emitting layer 29 by vapor deposition, and an Al film is formed to a thickness of 300 nm thereon. It is appreciated that a MgAg electrode that is a known negative electrode material may be used. The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening portion before forming the light-emitting layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealant 19 and the substrate 10 (the gap is filled with a sealant 81). Herein, although description is made with respect to the wiring 16, the other wirings 14 and 15 are also electrically connected to the FPC 17 through a gap between the sealant 81.

Figures 18A, 18B:
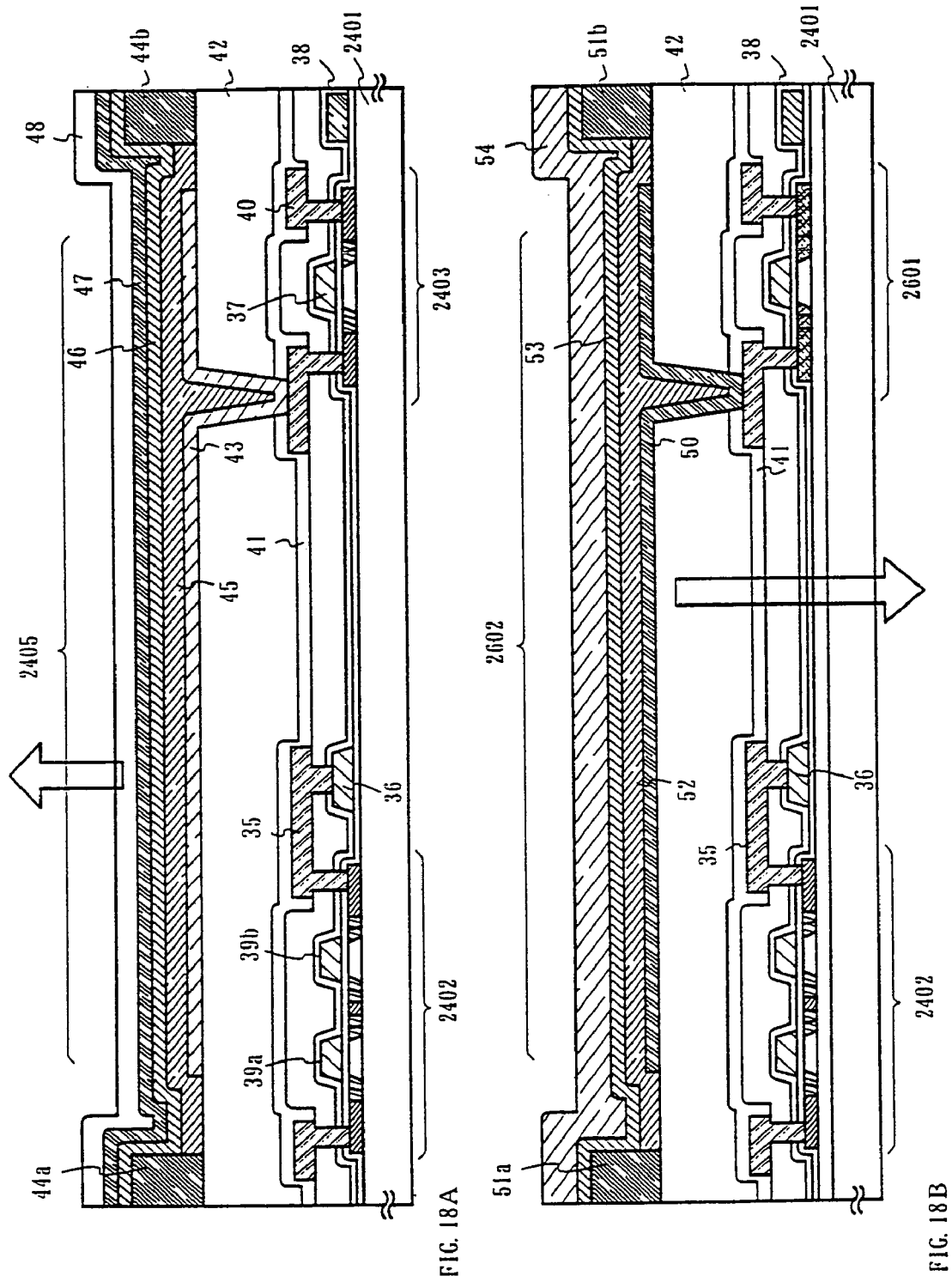
FIGS. 18A-18B are cross sectional views showing a pixel part of an EL display device.
Figure 19A:
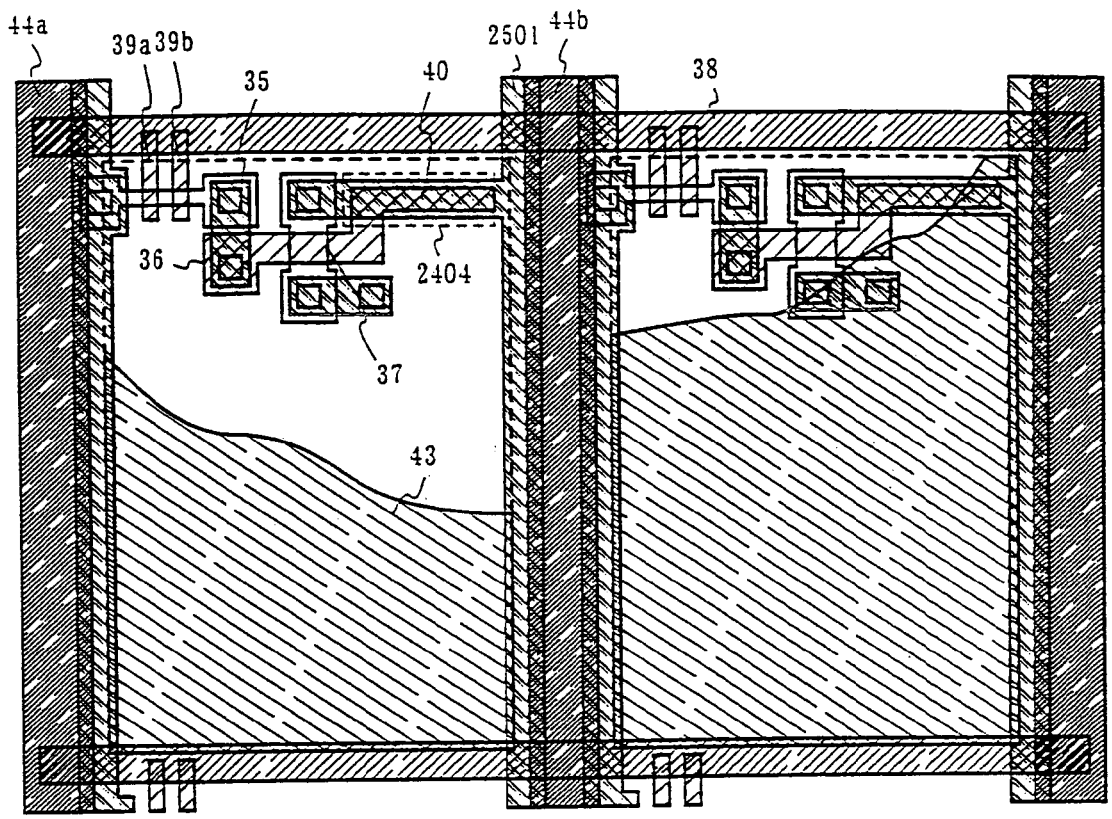
FIGS. 19A-19B are a top plan views and a circuit diagram showing a pixel part of an EL display device.
Figure 19B:
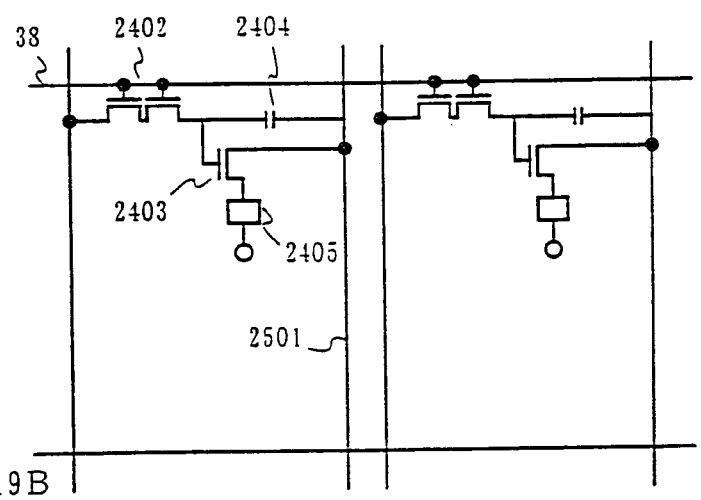

FIG. 18 shows a more detailed cross-sectional structure of the pixel portion. FIG. 19A shows a top view thereof, and FIG. 19B shows a circuit diagram thereof. In FIG. 18A, a switching TFT 2402 provided on a substrate 2401 is formed according to the same structure of the pixel TFT 204 shown in FIG. 6C of Embodiment 1. Due to the double-gate structure, there is an advantage in that substantially two TFTs are connected in series to reduce an OFF current value. In this embodiment, the TFT 2402 has a double-gate structure; however, it may have a triple gate structure, or a multi-gate structure having more gates.

A current controlling TFT 2403 is formed by using the n-channel TFT 201 shown in FIG. 6C. At this time, a drain wiring 35 of the switching TFT 2402 is electrically connected to a gate electrode 37 of the current controlling TFT by a wiring 36. Furthermore, a wiring 38 is a gate wiring electrically connected to gate electrodes 39a and 39b of the switching TFT 2402.

At this time, it is very important that the current controlling TFT 2403 has a structure of the present invention. The current controlling TFT functions as an element for controlling the amount of a current flowing through an EL element, so that the current controlling TFT 2403 is likely to be degraded by heat and hot carriers due to a large amount of current flown therethrough. Therefore, an LDD region overlapping with a gate electrode, is provided on the current controlling TFT, thereby preventing the deterioration of TFT and enhancing the stability of the operation.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 19A, a wiring to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin-insulating film is formed thereon. It is very important to flatten the step difference due to TFTs by using the flattening film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 44 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, a π-conjugate polymer material is used. Examples of the typical polymer material include polyparaphenylene vinylene (PPV), polyvinyl carbazole (PVK), and polyfluorene. There are various types of PPV organic EL materials. For example, materials as described in H. Shenk, H. Becker, O. Gelsen, E. Kluge, W. Kreuder, and H. Spreitzer, Polymers for Light Emitting Diodes, Euro Display, Proceedings, 1999, p. 33-37 and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm). The above-mentioned organic EL materials are merely examples for use as a light-emitting layer, so that the present invention is not limited thereto. A light-emitting layer, an electric charge transporting layer, or an electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for an electric charge transporting layer and an electric charge injection layer. As these organic EL materials and inorganic materials, known materials can be used.

In this embodiment, an light emitting layer with a lamination structure is used, in which a hole injection layer 46 made of PEDOT (polythiophene) or PANi (polyaniline) is provided on the light-emitting layer 45. An anode 47 made of a transparent conductive film is provided on the hole injection layer 46. In this embodiment, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The transparent conductive film is formed after forming the light-emitting layer and the hole injection layer with low heat resistance, so that the conductive film that can be formed at a possibly low temperature is preferably used.

When the anode 47 is formed, the self-emitting element 2405 is completed. The EL element 2405 refers to a capacitor composed of the pixel electrode (cathode) 43, the light-emitting layer 45, the hole injection layer 46, and the anode 47. As show in FIG. 19A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 19, and includes a switching TFT having a sufficiently low OFF current value and a current controlling TFT that is strong to the injection of hot carriers. Thus, an EL display panel having high reliability and is capable of displaying a satisfactory image, is obtained.

In this embodiment, referring to FIG. 18B, the case will be described where the structure of the light-emitting layer is reversed. The current control TFT 2601 is formed using a p-channel type TFT 200 of FIG. 6B. The manufacturing process is referred to Embodiment 1. In this embodiment, a transparent conductive film is used as a pixel electrode (anode) 50. Specifically, a conductive film comprising a compound of indium oxide and zinc oxide. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 1 and 2. Furthermore, it is effective to use the EL display panel of this embodiment as a display portion of electronic equipment of Embodiment 8.

Embodiment 6

In this embodiment, referring to FIG. 20, the case will be described where a pixel having a structure different from that of the circuit diagram shown in FIG. 19B is used. Reference numeral 2701 denotes a source wiring of a switching TFT 2702, 2703 denotes a gate wiring of the switching TFT 2702, 2704 denotes a current controlling TFT, 2705 denotes a capacitor, 2706 and 2708 denote current supply lines, and 2707 denotes an EL element.

Figure 20A:
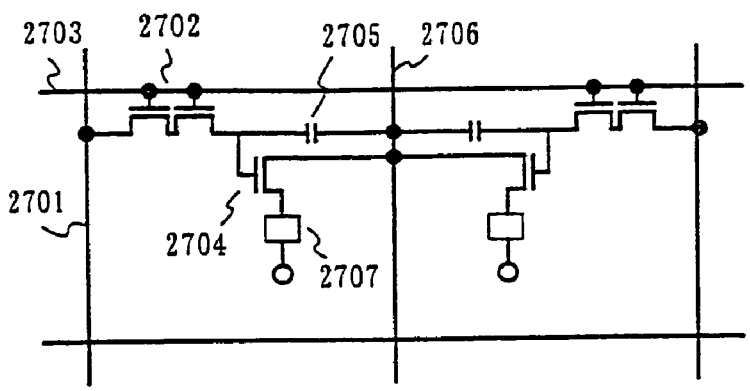
FIGS. 20A-20C are examples of circuit diagrams of a pixel part of an EL display device.

FIG. 20A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 20B:
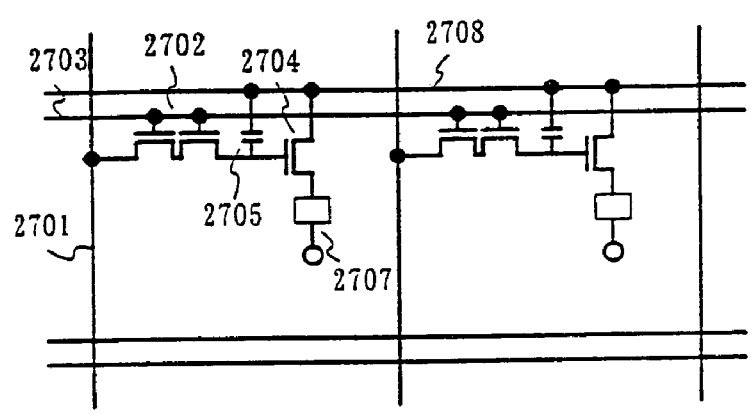

Furthermore, FIG. 20B shows the case where the current supply line 2708 and the gate wiring 2703 are provided in parallel. In FIG. 20B, although the current supply line 2708 does not overlap the gate wiring 2703, if both lines are formed on different layers, they can be provided so as to overlap each other via an insulating film. In this case, the current supply line 2708 and the gate wiring 2703 can share an occupied area, so that a pixel portion is allowed to have higher definition.

Figure 20C:
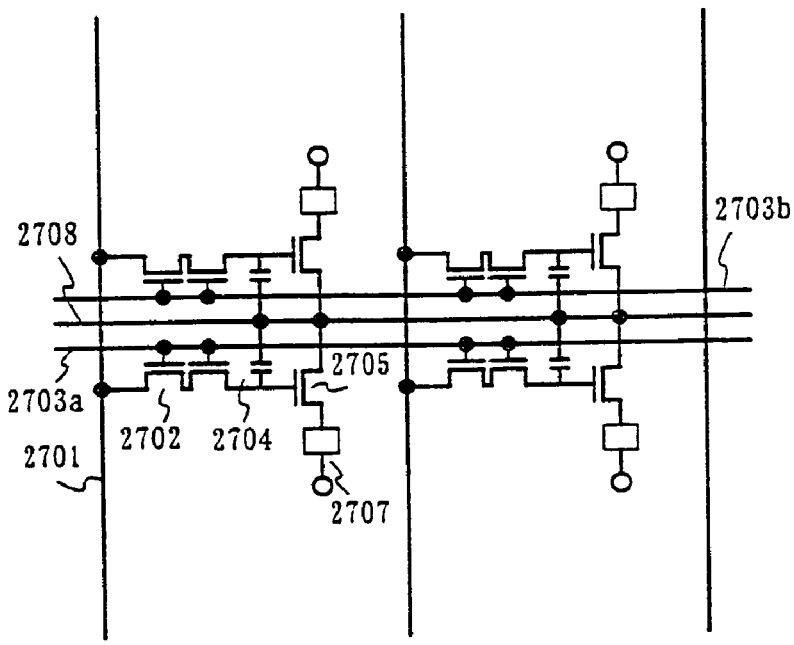

Furthermore, FIG. 20C shows the case where the current supply line 2708 and gate wiring 2703 are provided in parallel in the same way as in FIG. 20B, and two pixels are formed so as to be axisymmetric with respect to the current supply line 2708. It is also effective to provide the current supply line 2708 so as to overlap one of the gate wirings 2703. In this case, the number of the power supply lines can be reduced, so that a pixel portion is allowed to have higher definition. In FIGS. 20A and 22B, the capacitor 2404 is provided so as to hold a voltage applied to a gate of the current controlling TFT 2403. However, the capacitor 2404 can be omitted.

Since the n-channel TFT according to the present invention as shown in FIG. 18A is used as the current controlling TFT 2403, the current controlling TFT 2403 has an LDD region provided so as to overlap a gate electrode via a gate insulating film. In this overlapping region, a parasitic capacitor called as a gate capacitor is generally formed. This embodiment is characterized in that the parasitic capacitor is actively used in place of the capacitor 2404. The capacitance of the parasitic capacitor is varied depending upon the area in which the above-mentioned gate electrode overlaps the LDD region. Therefore, the capacitance is determined by the length of the LDD region included in the region. Similarly, in the structure shown in FIGS. 20A, 20B, and 20C, the capacitor 2705 can also be omitted.

This embodiment can be realized by being appropriately combined with the structures of TFT in Embodiments 1 and 2. Furthermore, it is effective to use an EL display panel of this embodiment as a display portion of electronic equipment of Embodiment 8.

Embodiment 7

In the present embodiment, a description will be given on a semiconductor device incorporating an active matrix liquid crystal display device made from a TFT circuit of the present invention, referring to FIGS. 21 to 23.

As such a semiconductor device, a portable information terminal (an electronic book, a mobile computer or a cellular phone), a video camera, a still-image camera, a personal computer, TV etc. may be enumerated. Examples of those are shown in FIGS. 21 and 22.

Figure 21A:
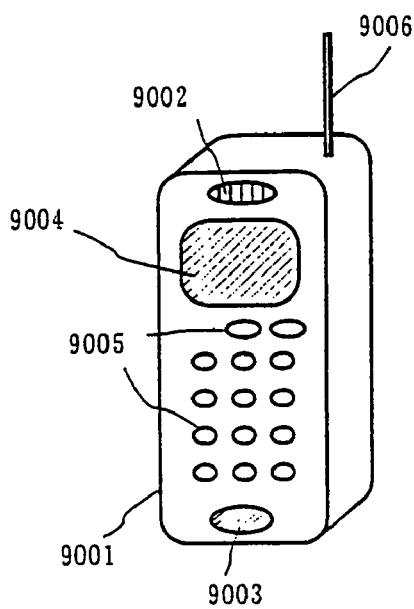
FIGS. 21A-21F are schematic views showing examples of a semiconductor device.

FIG. 21A is a cellular phone, and it includes a main body 9001, a voice output section 9002, a voice input section 9003, a display device 9004, operation switches 9005, and an antenna 9006. The present invention can be applied to the voice output-section 9002, the voice input section 9003 and the display device 9004 having an active matrix substrate.

Figure 21B:
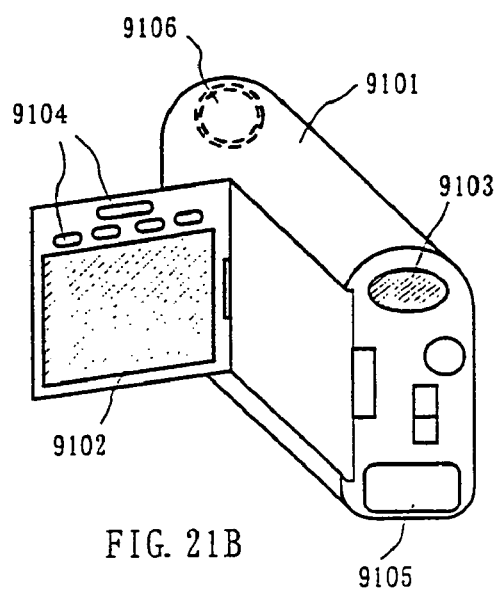

FIG. 21B shows a video camera, and it includes a main body 9101, a display device 9102, a voice input unit 9103, operation switches 9104, a battery 9105, and an image receiving unit 9106. The present invention is applicable to the display device 9102 having an active matrix substrate and the image receiving unit 9106.

Figure 21C:
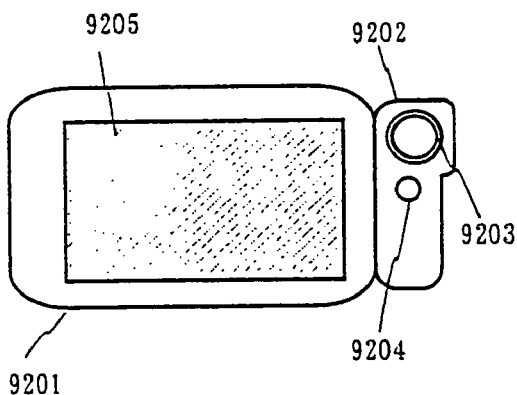

FIG. 21C shows a mobile computer or a portable information terminal, and it includes a main body 9201, a camera unit 9202, an image receiving unit 9203, operation switches 9204, and a display device 9205. The present invention can be applied to the image receiving unit 9203 and the display device 9205 having an active matrix substrate.

Figure 21D:
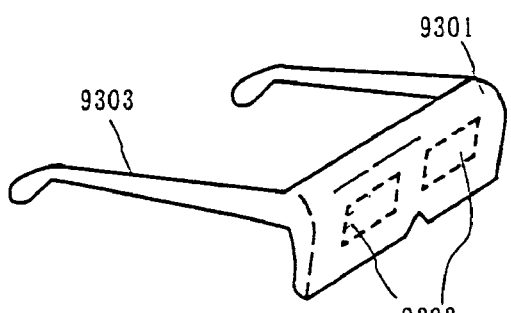

FIG. 21D shows a head mount display, and it includes a main body 9301, a display device 9302 and arm portions 9303. The present invention can be applied to the display device 9302. Further, although not shown, the present invention can also be used for other driving circuits.

Figure 21E:
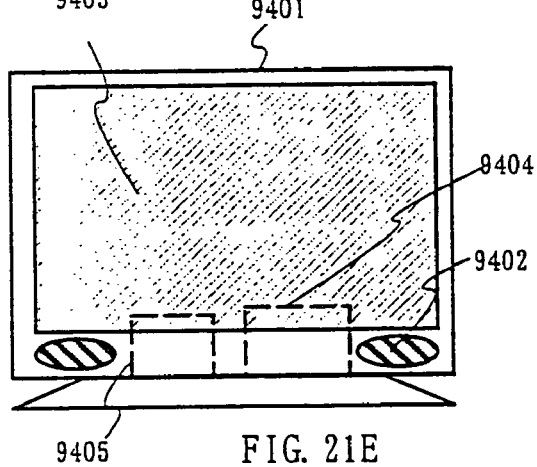

FIG. 21E shows television, and it includes a main body 9401, a speaker 9402, display device 9403, a receiving apparatus 9404, an amplifier 9405 and so forth. The liquid crystal display device shown in Embodiment 5 and the EL display device shown in Embodiment 6 or 7 can be applied to the display device 9403.

Figure 21F:
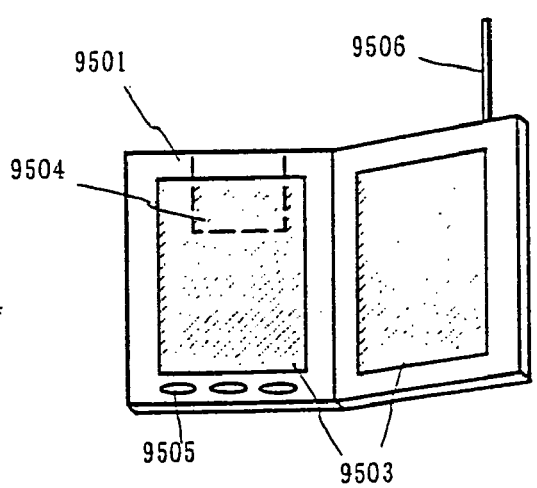

FIG. 21F shows a portable electronic book, and it includes a main body 9501, display devices 9502, 9503, a memory medium 9504, an operation switch 9505 and an antenna 9506. The book is used to display data stored in a mini-disk (MD) or a DVD, or a data received with the antenna. The display devices 9502, 9503 are direct-vision type display devices, to which the present invention may be applied.

Figure 22A:
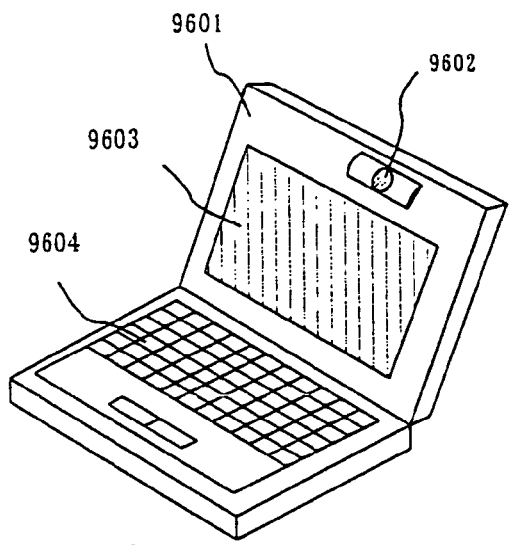
FIGS. 22A-22C are schematic views showing examples of a semiconductor device.
Figure 22B:
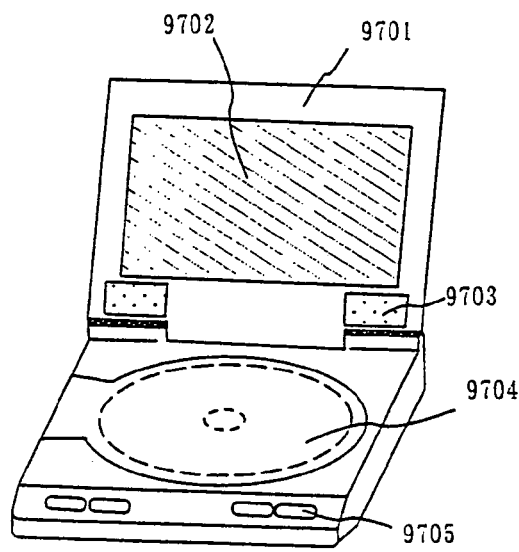

FIG. 22A shows a personal computer comprising a main body 9601, an image inputting unit 9602, a display device 9603 and a key board 9604.

FIG. 22B shows a player that employs a recording medium in which programs are recorded (hereinafter referred to as a recording medium), and comprises a main body 9701, a display device 9702, a speaker unit 9703, a recording medium 9704, and an operation switch 9705. Incidentally, this player uses a DVD (Digital Versatile Disc), CD and the like as the recording medium to appreciate music and films, play games, and connect to the Internet.

Figure 22C:
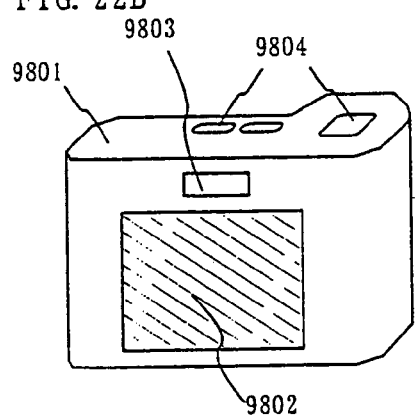

FIG. 22C shows a digital camera comprising a main body 9801, a display device 9802, an eye piece section 9803, operation switches 9804, and an image receiving unit (not shown).

Figure 23A:
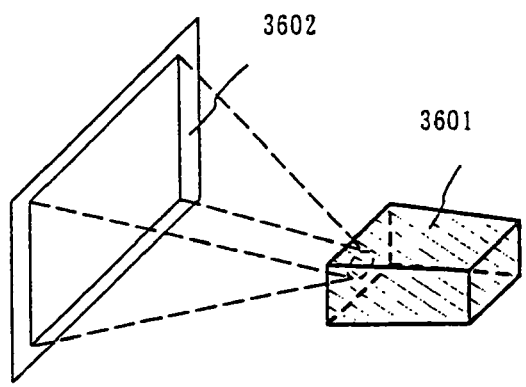
FIGS. 23A-23D are schematic views showing examples of a projector.

FIG. 23A shows a front-type projector comprising a display device 3601 and a screen 3602. The present invention is applicable to the display device and other driving circuits.

Figure 23B:
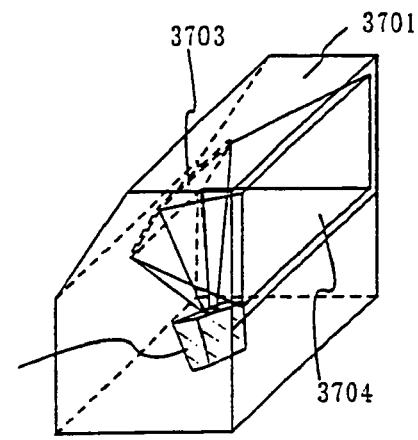

FIG. 23B shows a rear-type projector comprising a main body 3701, a projection device 3702, a mirror 3703, and a screen 3704. The present invention is applicable to the display device and other driving circuits.

Figure 23C:
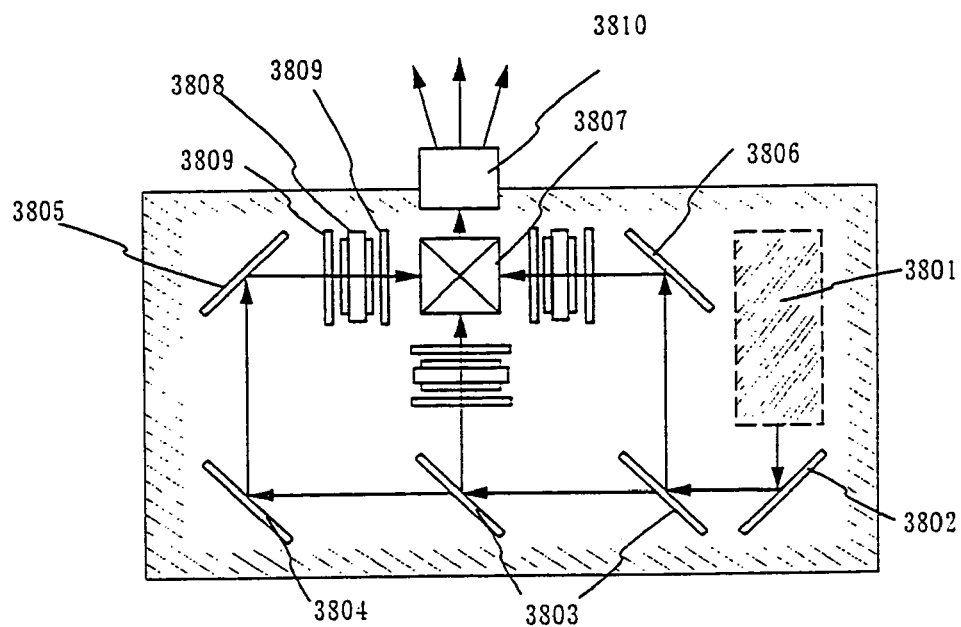

FIG. 23C is a diagram showing an example of the structure of the projection devices 3601, 3702 in FIGS. 23A and 23B. The projection device 3601 or 3702 comprises a light source optical system 3801, mirrors 3802, 3804 to 3806, dichroic mirrors 3803, a prism 3807, liquid crystal display devices 3808, phase difference plates 3809, and a projection optical system 3810. The projection optical system 3810 is composed of an optical system including a projection lens. This example shows an example of three plate type but not particularly limited thereto. For instance, the invention may be applied also to a single plate type optical system. Further, in the light path indicated by an arrow in FIG. 23C, an optical system such as an optical lens, a film having a polarization function, a film for adjusting a phase difference, and an IR film may be suitably provided by a person who carries out the invention.

Figure 23D:
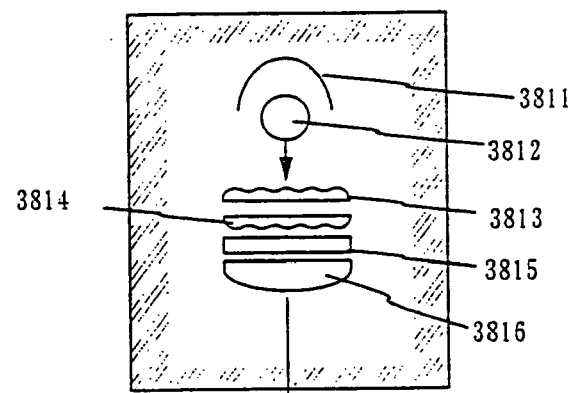

FIG. 23D is a diagram showing an example of the structure of the light source optical system 3801 in FIG. 23C. In this embodiment, the light source optical system 3801 comprises a reflector 3811, a light source 3812, lens arrays 3813, 3814, a polarization conversion element 3815, and a condenser lens 3816. The light source optical system shown in FIG. 23D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Additionally, the present invention can be applied to image sensors and EL type display elements. As described above, the application range of the present invention is extremely broad, and the invention can be applied to electronic appliances of all fields.

Embodiment 8

In order to confirm the effectiveness of the present invention, of the nonmetal element (one kind of or plural kinds of elements selected from the group consisting of B, Si, P, As, He, Ne, Ar, Kr, and Xe), Argon (Ar) is employed to carry out the following experimentations.

After the solution containing 10 ppm nickel acetate has been applied to the amorphous silicon film of the thickness of 50 nm, the dehydrogenation treatment is performed at 500° C. for 1 hour and then the heat treatment is performed at 550° C. for 4 hours to crystallize the amorphous silicon film. Thus, the resultant crystalline semiconductor film is employed therefor. After this crystalline semiconductor film has been patterned, the silicon oxide film with 90 nm thickness is formed. Then, the sample in which gettering site is doped with phosphorus ion by utilizing the ion doping method, the sample in which after phosphorus has been implanted, argon is implanted thereinto, and the sample in which only argon is implanted are respectively prepared to be compared with one another and evaluated. At this time, with respect to the conditions of implanting phosphorus, 5% $PH_3$ diluted with hydrogen is employed, and the acceleration voltage is 80 keV, and dose is $1.5 \times 10^{15}/cm^2$. The time required for the implantation is about 8 minutes and phosphorus can be implanted into the crystalline semiconductor film with the mean concentration of $2 \times 10^{20}/cm^3$. On the other hand, argon is implanted at the acceleration voltage of 90 keV with a dose of $2 \times 10^{15}$ or $4 \times 10^{15}/cm^2$. By the way, 99.9999% or more argon is employed and the time required for the implantation is desirably 1 to 2 minutes.

Figure 25:
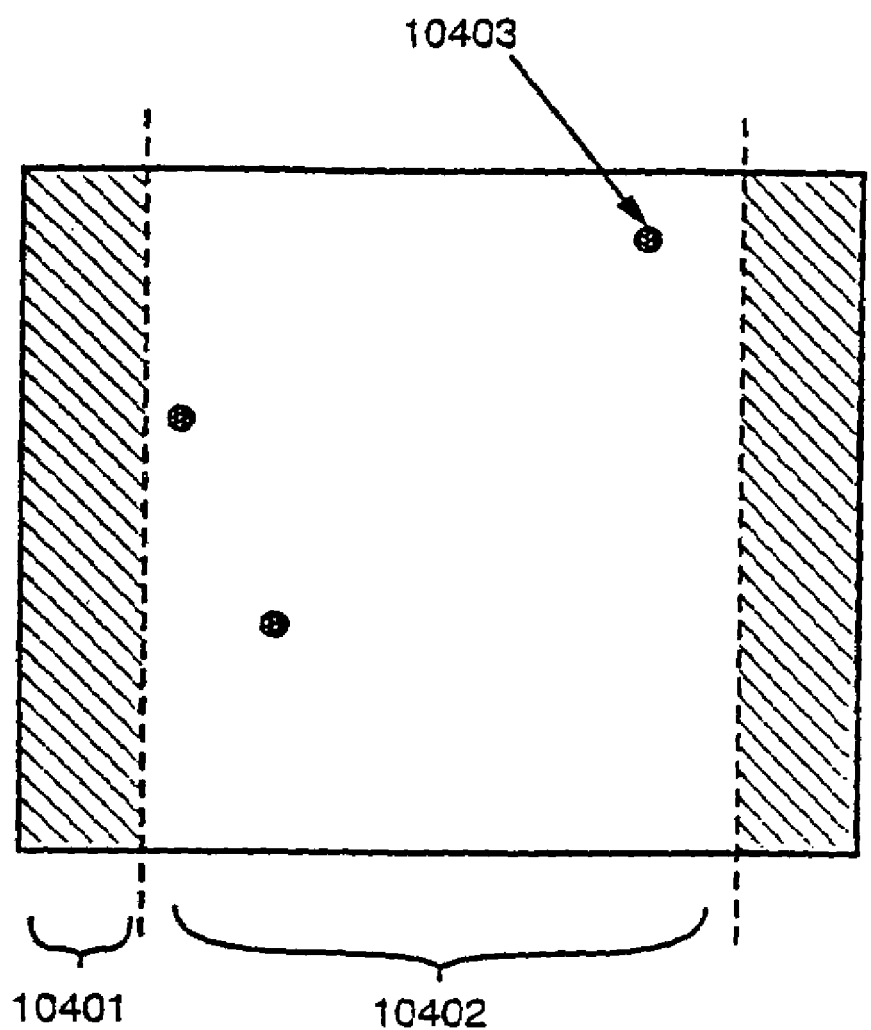
FIG. 25 is a schmatic view showing the etch pit which is observed through the FPM processing after completion of gettering.

For gettering, the heat treatment is performed at 550° C. for 4 hours in nitrogen ambient. After completion of gettering, the silicon oxide film is removed and then the processing is performed with FPM. The effect of gettering is confirmed on the basis of the number of etch pits in the region, in which gettering is to be performed, in the crystalline semiconductor film. That is, while most of nickel added thereto remains in the form of nickel silicide in the crystalline semiconductor film, it is known that this nickel silicide can be etched away by the FPM (mixed solution of hydrofluoric acid, hydrogen peroxide and pure water). Therefore, the region in which gettering is to be performed is treated with the FPM to confirm the presence or absence of the etch pits, whereby it is possible to confirm the effect of gettering. In this case, it is meant that the less the number of etch pits is, the higher the effect of gettering is. FIG. 25 is a schematic view showing the sample in which the etch pits are formed. By the way, in FIG. 25, a doped region 10401 shows the region to which argon or phosphorus is added. Then, the number of etch pits 10403 which are present in a region for which gettering has been performed (gettered region) 10402 is counted by observing the etch pits 10403 to obtain the etch pits density.

Figure 24:
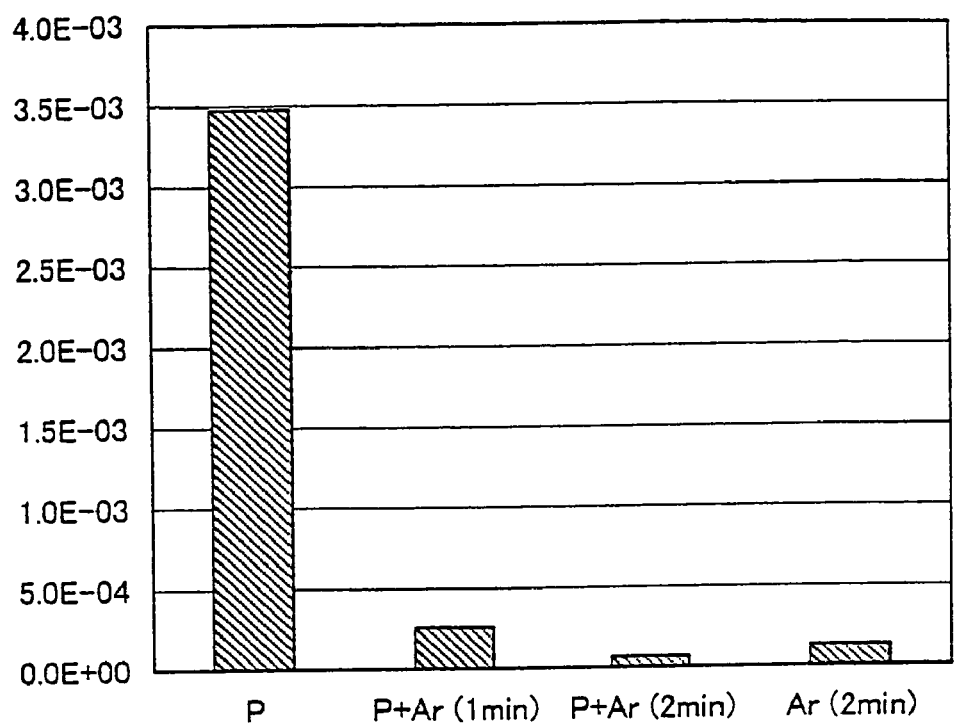
FIG. 24 is a graphical representation showing the etch pit density which is observed through the FPM processing after completion of gettering.

The results are shown in FIG. 24. In the figure, the sample denoted with P is the sample to which only phosphorus is added, and with respect to the implantation conditions of phosphorus of this sample, 5% $PH_3$ diluted with hydrogen is employed, the acceleration voltage is 80 keV and a dose is $1.5 \times 10^{15}/cm^2$. In addition, in FIG. 24, the sample denoted with P+Ar(1 min) is the sample to which phosphorus and argon are both added and with respect to the implantation conditions of phosphorus of this sample, 5% $PH_3$ diluted with hydrogen is employed, the acceleration voltage is 80 keV, and a dose is $1.5 \times 10^{15}/cm^2$, while with respect to the implantation conditions of argon, the acceleration voltage is 90 keV, and a dose is $2 \times 10^{15}/cm^2$, and the time required to implant argon is 1 minute. In addition, in FIG. 24, the sample denoted by P+Ar(2 min) is the sample to which phosphorus and argon are both added, and with respect to the implantation conditions of phosphorus of this sample, 5% $PH_3$ diluted with hydrogen is employed, the acceleration voltage is 80 keV, and a dose is $1.5 \times 10^{15}/cm^2$, while with respect to the implantation conditions of argon, the acceleration voltage is 90 keV, and a dose is $4 \times 10^{15}/cm^2$, and the time required to implant argon is 2 minutes. Also, in FIG. 24, the sample denoted with Ar is the sample to which only argon is added, and with respect to the implantation conditions of argon of this sample, the acceleration voltage is 90 keV, and a dose is $2 \times 10^{15}/cm^2$.

From the experimentation results shown in FIG. 24, it is understood that the sample to which only phosphorus is added has the etch pits density of $3.5 \times 10^{-3}$ pieces/$\mu m^2$, while the sample which has argon added thereto to carry out gettering therefor has the number of etch pits equal to or smaller than $5 \times 10^{-4}$ pieces/$\mu m^2$, and therefore the number of etch pits is remarkably reduced. These results mean that argon is implanted, thereby enhancing extremely the effect of gettering, and also show that gettering employing the nonmetal element of the present invention (one kind or plural kinds of elements selected from the group consisting of B, Si, P, As, He, Ne, Ar, Kr, and Xe) is very effective.

INDUSTRIAL APPLICABILITY

As set forth hereinabove, according to the present invention, at least one of the efficiency and the effect of gettering when gettering the metal contained in the crystalline semiconductor thin film containing silicon as the main component is improved.

In the present specification, improving the efficiency of gettering means that the heat supply amount (=the temperature×the time) for reducing the amount of metal contained in the active region is made less.

In addition, in the present specification, improving the effect of gettering means that even in the case of the same heat supply amount, the remaining amount of metal to be gettered in the element active region is made less.

The invention claimed is:

1. A method of manufacturing a semiconductor device, comprising:
   forming a semiconductor film comprising amorphous silicon;
   adding metal to said semiconductor film comprising amorphous silicon;
   crystallizing said semiconductor film comprising amorphous silicon by a first heat treatment;
   forming a mask over the crystallized semiconductor film;
   adding a material for gettering a region of the crystallized semiconductor film in accordance with said mask; and
   subjecting the crystallized semiconductor film to a second heat treatment to getter said metal to the region to which said material for gettering has been added,
   wherein a periphery of said mask for the surface parallel with the surface of said crystalline semiconductor film includes a plurality of recessed portions.

2. A method of manufacturing a semiconductor device according to claim 1 wherein the metal is added by using a solution containing a compound of the metal.

3. A method of manufacturing a semiconductor device according to claim 1, wherein said mask is an insulating film.

4. A method of manufacturing a semiconductor device according to claim 1, wherein said metal is selected from the group consisting of nickel, cobalt, palladium, platinum and copper.

5. A method of manufacturing a semiconductor device according to claim 1, wherein said first heat treatment is performed at the temperature equal to or higher than 400° C. and equal to or lower than 700° C.

6. A method of manufacturing a semiconductor device according to claim 1, wherein said material for gettering is one kind or plural kinds of elements selected from the group consisting of boron, silicon, phosphorus, arsenic, helium, neon, argon, krypton and xenon.

7. A method of manufacturing a semiconductor device according to claim 1, wherein said second heat treatment is performed at the temperature equal to or higher than 400° C. but equal to or tower than 1,000° C.

8. A method of manufacturing a semiconductor device, comprising:
   forming a semiconductor film comprising amorphous silicon;
   adding metal to said semiconductor film comprising amorphous silicon;
   crystallizing said semiconductor film comprising amorphous silicon by a first heat treatment;
   forming a mask over the crystallized semiconductor film wherein the mask covers a first region of the crystallized semiconductor film;
   adding a material for gettering a second region of the crystallized semiconductor film in accordance with said mask; and
   subjecting the crystallized semiconductor film to a second heat treatment to getter said metal to the second region to which said material for gettering has been added,
   wherein a periphery of said mask for the surface parallel with the surface of said crystalline semiconductor film has an irregular shape such that a contact area between the first region and the second region is increased.

9. A method of manufacturing a semiconductor device according to claim 8 wherein the metal is added by using a solution containing a compound of the metal.

10. A method of manufacturing a semiconductor device according to claim 8, wherein said mask is an insulating film.

11. A method of manufacturing a semiconductor device according to claim 8, wherein said metal is selected from the group consisting of nickel, cobalt, palladium, platinum and copper.

12. A method of manufacturing a semiconductor device according to claim 8, wherein said first heat treatment is performed at the temperature equal to or higher than 400° C. and equal to or lower than 700° C.

13. A method of manufacturing a semiconductor device according to claim 8, wherein said material for gettering is one kind or plural kinds of elements selected from the group consisting of boron, silicon, phosphorus, arsenic, helium, neon, argon, krypton and xenon.

14. A method of manufacturing a semiconductor device according to claim 8, wherein said second heat treatment is performed at the temperature equal to or higher than 400° C. but equal to or lower than 1,000° C.

15. A method of manufacturing a semiconductor device, comprising:
   forming a semiconductor film comprising amorphous silicon;
   adding metal to said semiconductor film comprising amorphous silicon;
   crystallizing said semiconductor film comprising amorphous silicon by a first heat treatment;
   forming a mask over the crystallized semiconductor film wherein the mask covers a first region of the crystallized semiconductor film;
   adding a material for gettering a second region of the crystallized semiconductor film in accordance with said mask; and
   subjecting the crystallized semiconductor film to a second heat treatment to getter said metal to the second region to which said material for gettering has been added,
   wherein a cross sectional shape of the mask parallel to a plane of the semiconductor film includes a Koch curve such that a contact area between the first region and the second region is increased.

16. A method of manufacturing a semiconductor device according to claim 15 wherein the metal is added by using a solution containing a compound of the metal.

17. A method of manufacturing a semiconductor device according to claim 15, wherein said mask is an insulating film.

18. A method of manufacturing a semiconductor device according to claim 15, wherein said metal is selected from the group consisting of nickel, cobalt, palladium, platinum and copper.

19. A method of manufacturing a semiconductor device according to claim 15, wherein said first heat treatment is performed at the temperature equal to or higher than 400° C. and equal to or lower than 700° C.

20. A method of manufacturing a semiconductor device according to claim 15, wherein said material for gettering is one kind or plural kinds of elements selected from the group consisting of boron, silicon, phosphorus, arsenic, helium, neon, argon, krypton and xenon.

21. A method of manufacturing a semiconductor device according to claim 15, wherein said second heat treatment is performed at the temperature equal to or higher than 400° C. but equal to or lower than 1,000° C.

* * * * *